(12) United States Patent
Bohmer et al.

(10) Patent No.: US 11,881,542 B2
(45) Date of Patent: Jan. 23, 2024

(54) PIXELATED WAVELENGTH-CONVERSION LAYER

(71) Applicant: LUMILEDS LLC, San Jose, CA (US)

(72) Inventors: Marcel Rene Bohmer, Eindhoven (NL); Ken Shimizu, Sunnyvale, CA (US)

(73) Assignee: Lumileds LLC, San Jose, CA (US)

( * ) Notice: Subject to any disclaimer, the term of this patent is extended or adjusted under 35 U.S.C. 154(b) by 19 days.

(21) Appl. No.: 17/543,285

(22) Filed: Dec. 6, 2021

(65) Prior Publication Data

US 2022/0181526 A1 Jun. 9, 2022

Related U.S. Application Data

(60) Provisional application No. 63/122,109, filed on Dec. 7, 2020.

(51) Int. Cl.
H01L 33/50 (2010.01)

(52) U.S. Cl.
CPC .......... *H01L 33/504* (2013.01); *H01L 33/505* (2013.01); *H01L 2933/0041* (2013.01)

(58) Field of Classification Search
None
See application file for complete search history.

(56) References Cited

U.S. PATENT DOCUMENTS

| 8,367,152 | B2 | 2/2013 | Yokoyama et al. |
| 10,083,944 | B2 | 9/2018 | Lee |
| 10,388,693 | B2 | 8/2019 | Cha et al. |
| 10,770,436 | B2 | 9/2020 | Yeon et al. |
| 2014/0070244 | A1 | 3/2014 | Kim et al. |
| 2017/0294479 | A1* | 10/2017 | Cha .......................... H01L 33/62 |
| 2018/0151543 | A1* | 5/2018 | Lee ...................... H01L 23/5386 |

FOREIGN PATENT DOCUMENTS

| JP | 5073566 B2 | 11/2012 |
| KR | 2011-0098600 A | 9/2011 |

OTHER PUBLICATIONS

From the Korean Intellectual Property Office as the ISA, "Notification of Transmittal of the International Search Report and the Written Opinion of the International Searching Authority, or the Declaration", PCT/US2021/062138, dated Apr. 7, 2022, 12 pages.

* cited by examiner

*Primary Examiner* — Bo B Jang

(57) ABSTRACT

A first conversion layer material is formed on unmasked pixel areas of a substrate. Mask material is selectively removed from a second set of pixel areas, leaving a third set of pixel areas masked. A coating is formed on sidewalls of the second pixel areas, and then a second conversion layer material is formed on the second pixel areas and against their sidewalls. Mask material is removed from the third pixel areas, a coating is formed on sidewalls of the third pixel areas, and a third conversion layer material is formed on the third pixel areas and against their sidewalls. The resulting wavelength-conversion layer includes contiguously arranged regions of the first, second, and third conversion layer materials, at least two of which are wavelength-converting phosphor materials. The sidewall coatings between the regions act as barriers to lateral light transmission.

19 Claims, 21 Drawing Sheets

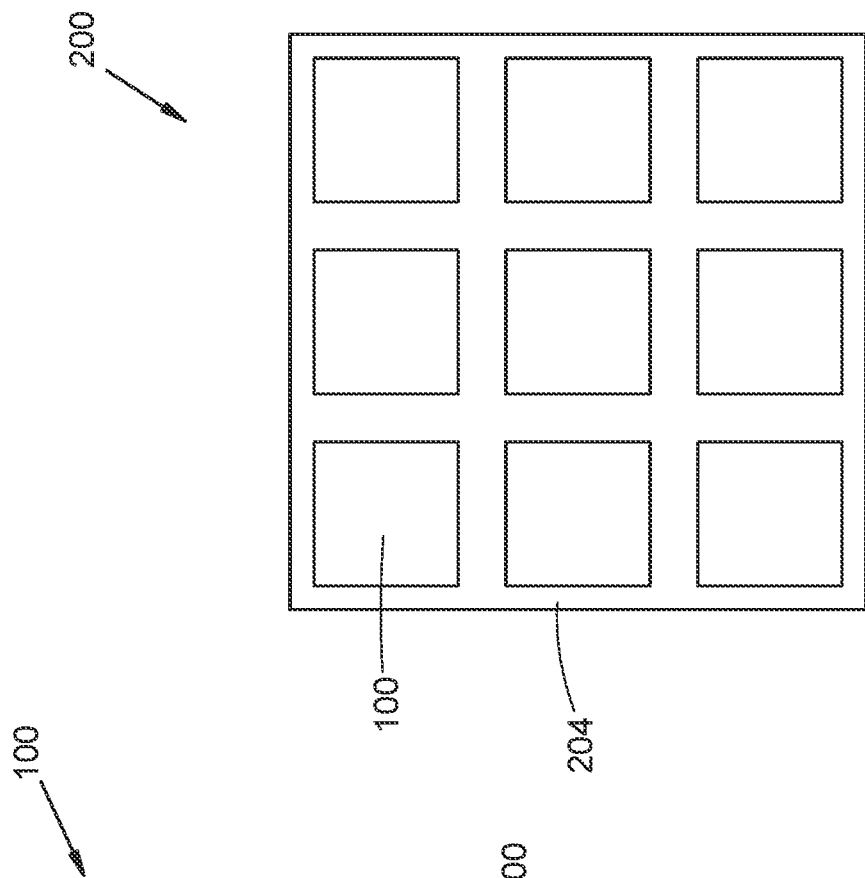
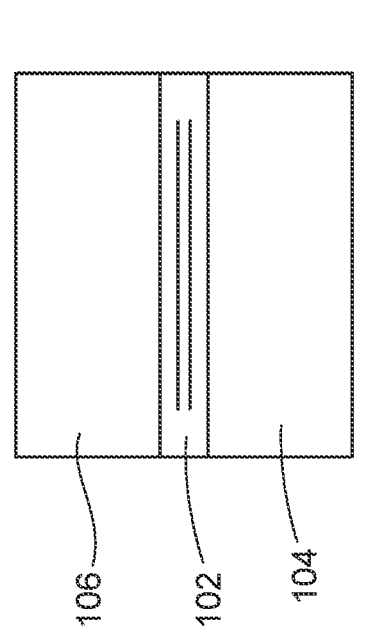
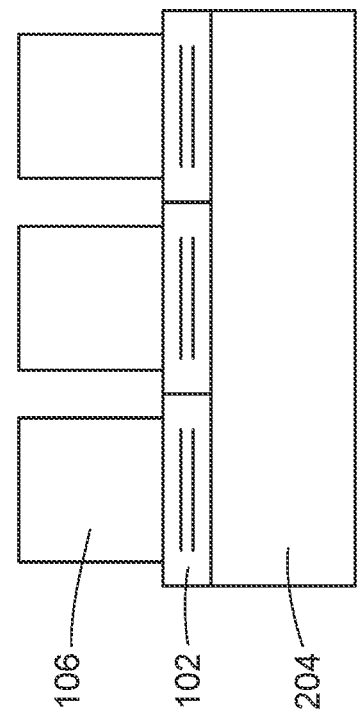

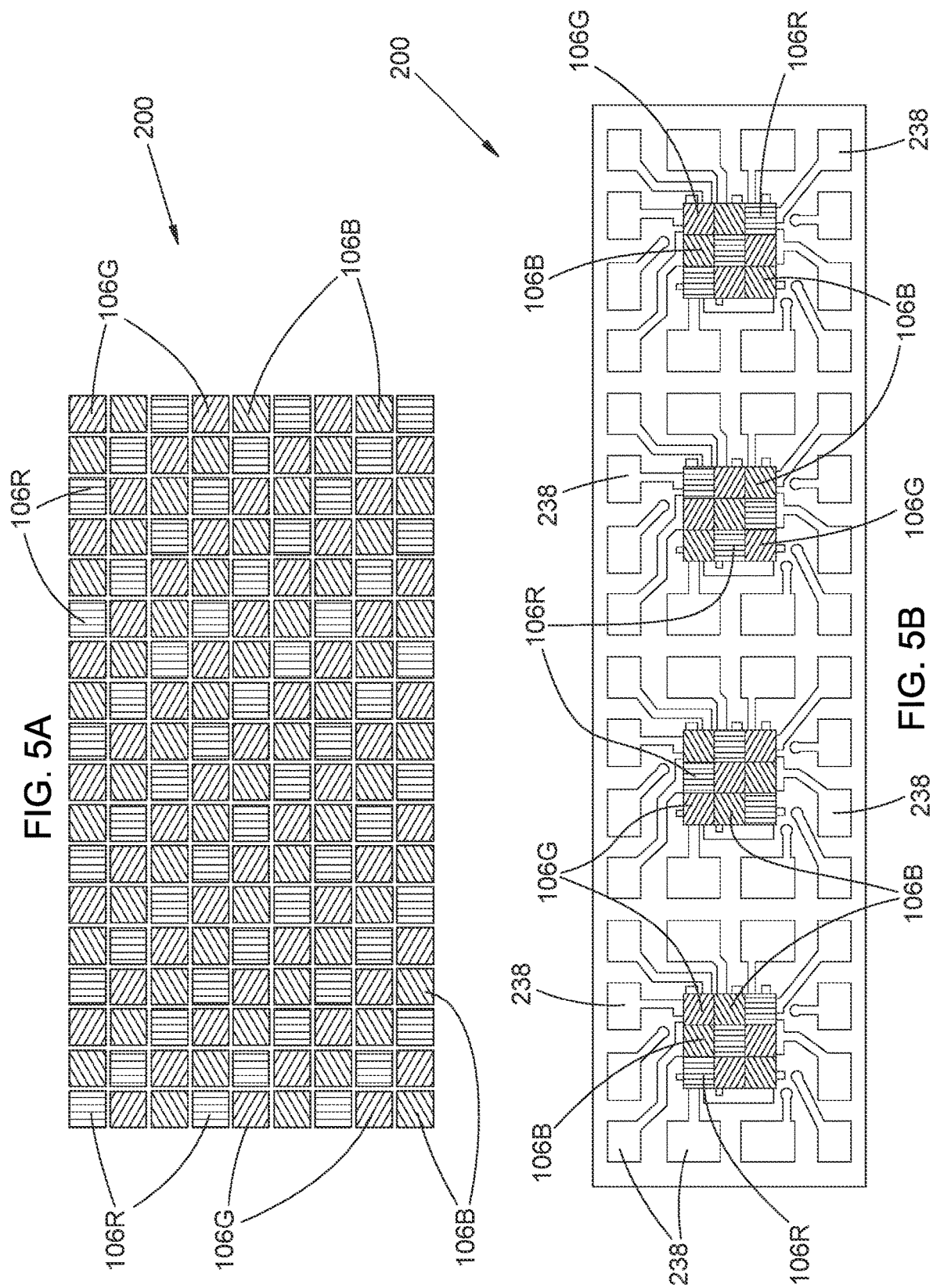

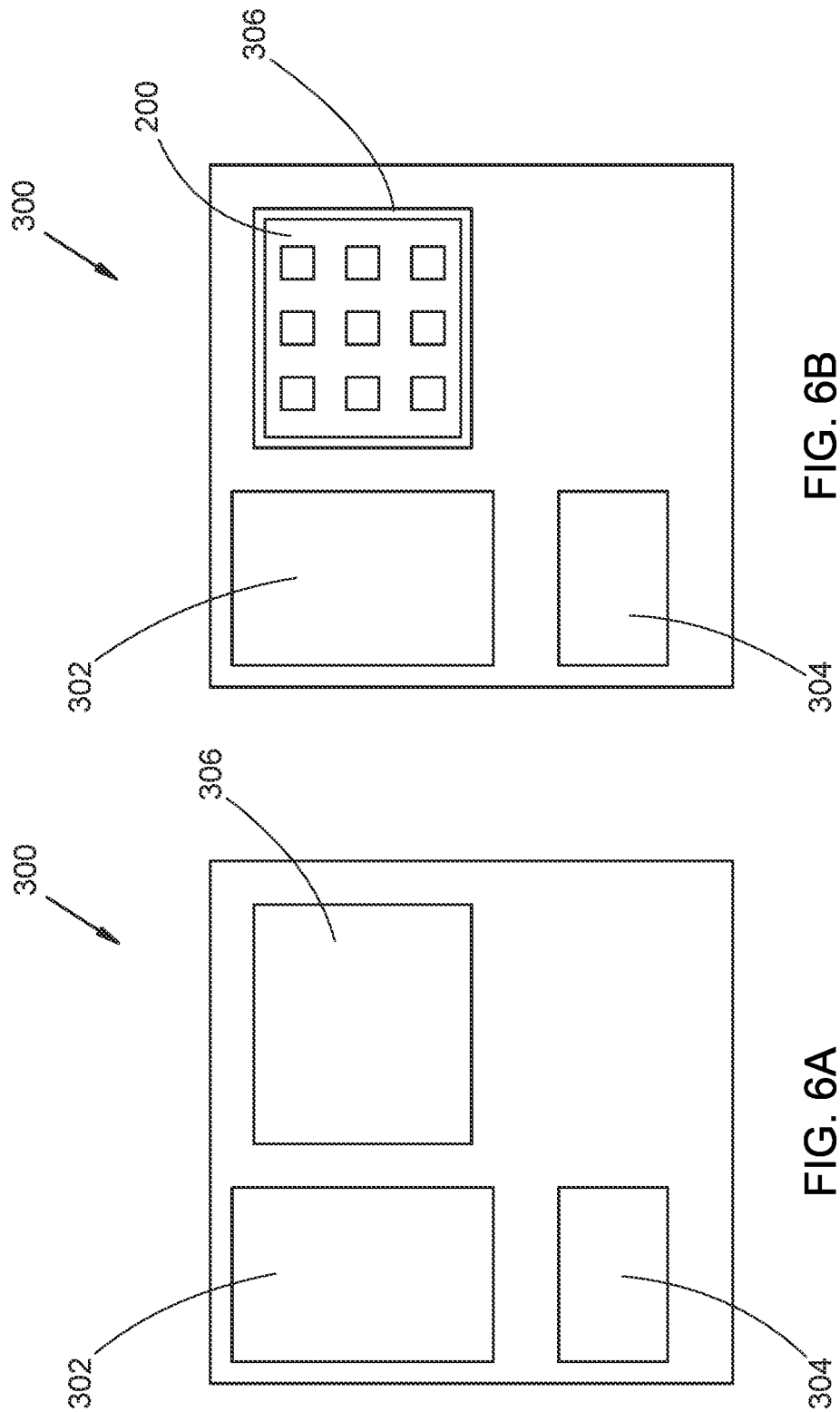

PIXELATED WAVELENGTH-CONVERSION LAYER

BENEFIT CLAIM

This application claims benefit of U.S. provisional App. No. 63/122,109 entitled "RGB-phosphor pixel structure for micro-led display" filed Dec. 7, 2020 in the names of Bohmer et al; said provisional application is incorporated herein by reference in its entirety.

FIELD OF THE INVENTION

The invention relates generally to light emitting diodes and to phosphor-converted light emitting diodes.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED. Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

Multiple LEDs or pcLEDs can be formed together on a single substrate to form an array. Such arrays can be employed to form active illuminated displays, such as those employed in, e.g., smartphones and smart watches, computer or video displays, augmented- or virtual-reality displays, or signage, or to form adaptive illumination sources, such as those employed in, e.g., automotive headlights, street lighting, camera flash sources, or flashlights (i.e., torches). An array having one or several or many individual devices per millimeter (e.g., device pitch or spacing of about a millimeter, a few hundred microns, or less than 100 microns, and separation between adjacent devices less than 100 microns or only a few tens of microns or less) typically is referred to as a miniLED array or a microLED array (alternatively, a µLED array). Such mini- or microLED arrays can in many instances also include phosphor converters as described above; such arrays can be referred to as pc-miniLED or pc-microLED arrays.

SUMMARY

A inventive method for making a wavelength-conversion layer begins by forming, growing, or depositing regions of a first conversion layer material on a set of unmasked first pixel areas of a surface of a substrate, with sets of second and third pixel areas of the substrate surface being masked. The sets of first, second, and third pixel areas contiguously fill at least a portion of the substrate surface. Mask material is selectively removed from the second pixel areas while leaving mask material on the third pixel areas, and a first sidewall layer is formed, grown, or deposited on exposed side surfaces of both the first conversion layer material and the remaining mask material. A second, different conversion layer material is formed, grown, or deposited on the second pixel areas and against the first sidewall layer. Mask material is then removed from the third pixel areas, and a second sidewall layer is formed, grown, or deposited on exposed side surfaces of the regions of the first conversion layer material and exposed portions of the first sidewall layer on side surfaces of the regions of the second conversion layer material. A third, different conversion layer material is formed, grown, or deposited regions of a third conversion layer material on the third pixel areas and against the second sidewall layer. At least two among the first, second, and third conversion layer materials are wavelength-converting phosphor materials.

The regions of the first, second, and third conversion layer materials forming a wavelength-conversion layer, with the regions of those materials being contiguously arranged in a single wavelength-conversion layer; each region extends entirely through the layer. Sidewall layers are positioned between each pair of adjacent regions against the respective conversion materials of those regions, extend entirely through the layer, and reduce transmission of light between adjacent regions of the conversion layer materials.

Objects and advantages pertaining to LEDs, pcLEDs, miniLED arrays, pc-miniLED arrays, microLED arrays, and pc-microLED arrays may become apparent upon referring to the examples illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 1 shows a schematic cross-sectional view of an example pcLED.

FIGS. 2A and 2B show, respectively, cross-sectional and top schematic views of an example array of pcLEDs.

FIG. 5A is a schematic top view of a portion of an example LED display in which each display pixel is a red, green, or blue phosphor-converted LED pixel. FIG. 5B is a schematic top view of a portion of an example LED display in which each display pixel includes multiple phosphor-converted LED pixels (red, green, and blue) integrated onto a single die that is bonded to a control circuit backplane.

FIG. 6A shows a schematic top view an example electronics board on which an array of pcLEDs may be mounted, and FIG. 6B similarly shows an example array of pcLEDs mounted on the electronic board of FIG. 6A.

Figure 3A:
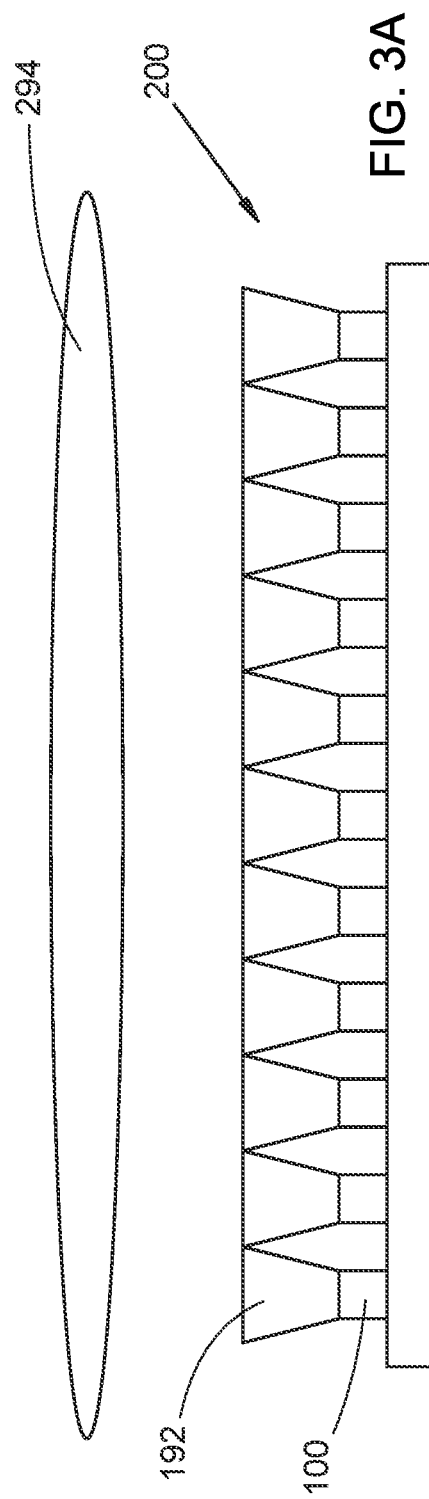
FIG. 3A shows a schematic cross-sectional view of an example array of pcLEDs arranged with respect to waveguides and a projection lens.

The examples depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. For example, individual LEDs may be exaggerated in their vertical dimensions or layer thicknesses relative to their lateral extent or relative to substrate or phosphor thicknesses. The examples shown should not be construed as limiting the scope of the present disclosure or appended claims.

DETAILED DESCRIPTION

The following detailed description should be read with reference to the drawings, in which identical reference numbers refer to like elements throughout the different figures. The drawings, which are not necessarily to scale, depict selective examples and are not intended to limit the scope of the inventive subject matter. The detailed description illustrates by way of example, not by way of limitation, the principles of the inventive subject matter. For purposes of simplicity and clarity, detailed descriptions of well-known devices, circuits, and methods may be omitted so as not to obscure the description of the inventive subject matter with unnecessary detail.

FIG. 1 shows an example of an individual pcLED 100 comprising a semiconductor diode structure 102 disposed on a substrate 104, together considered herein an "LED" or "semiconductor LED", and a wavelength converting structure (e.g., phosphor layer) 106 disposed on the semiconductor LED. Semiconductor diode structure 102 typically comprises an active region disposed between n-type and p-type layers. Application of a suitable forward bias across the diode structure 102 results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Other suitable material systems may include, for example, III-Phosphide materials, III-Arsenide materials, other binary, ternary, or quaternary alloys of gallium, aluminum, indium, nitrogen, phosphorus, or arsenic, or II-VI materials.

Any suitable phosphor materials may be used for or incorporated into the wavelength converting structure 106, depending on the desired optical output from the pcLED.

FIGS. 2A-2B show, respectively, cross-sectional and top views of an array 200 of pcLEDs 100, each including a phosphor pixel 106, disposed on a substrate 204. Such an array can include any suitable number of pcLEDs arranged in any suitable manner. In the illustrated example the array is depicted as formed monolithically on a shared substrate, but alternatively an array of pcLEDs can be formed from separate individual pcLEDs (e.g., singulated devices that are assembled onto an array substrate). Individual phosphor pixels 106 are shown in the illustrated example, but alternatively a contiguous layer of phosphor material can be disposed across multiple LEDs 102. In some instances the array 200 can include light barriers (e.g., reflective, scattering, and/or absorbing) between adjacent LEDs 102, phosphor pixels 106, or both. Substrate 204 may optionally include electrical traces or interconnects, or CMOS or other circuitry for driving the LED, and may be formed from any suitable materials.

Figure 3B:
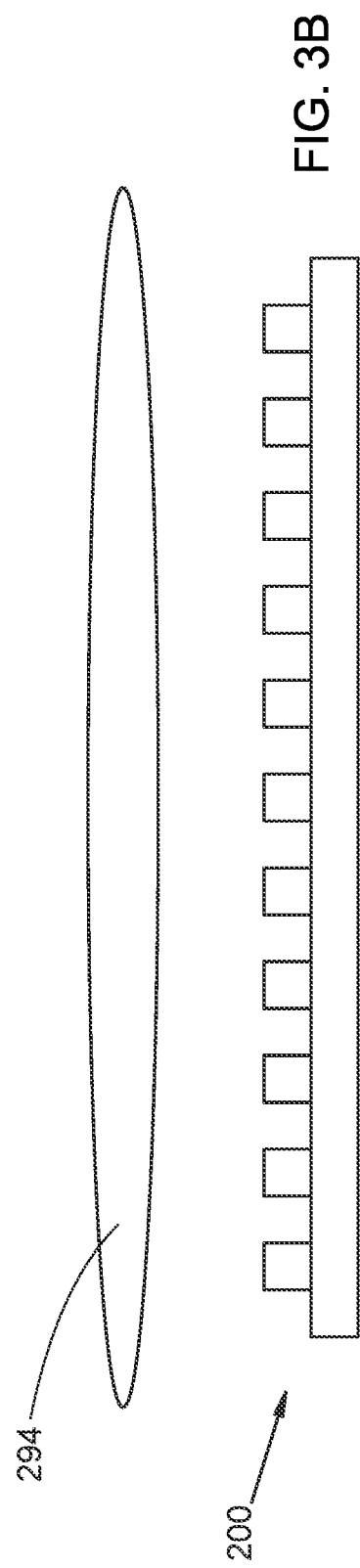
FIG. 3B shows an arrangement similar to that of FIG. 3A, but without the waveguides.

Individual pcLEDs 100 may optionally incorporate or be arranged in combination with a lens or other optical element located adjacent to or disposed on the phosphor layer. Such an optical element, not shown in the figures, may be referred to as a "primary optical element". In addition, as shown in FIGS. 3A and 3B, a pcLED array 200 (for example, mounted on an electronics board) may be arranged in combination with secondary optical elements such as waveguides, lenses, or both for use in an intended application. In FIG. 3A, light emitted by each pcLED 100 of the array 200 is collected by a corresponding waveguide 192 and directed to a projection lens 294. Projection lens 294 may be a Fresnel lens, for example. This arrangement may be suitable for use, for example, in automobile headlights or other adaptive illumination sources. Other primary or secondary optical elements of any suitable type or arrangement can be included for each pixel, as needed or desired. In FIG. 3B, light emitted by pcLEDs of the array 200 is collected directly by projection lens 294 without use of intervening waveguides. This arrangement may particularly be suitable when pcLEDs can be spaced sufficiently close to each other, and may also be used in automobile headlights as well as in camera flash applications or other illumination sources. A miniLED or microLED display application may use similar optical arrangements to those depicted in FIGS. 3A and 3B, for example. Generally, any suitable arrangement of optical elements (primary, secondary, or both) can be used in combination with the pcLEDs described herein, depending on the desired application.

Figure 4A:
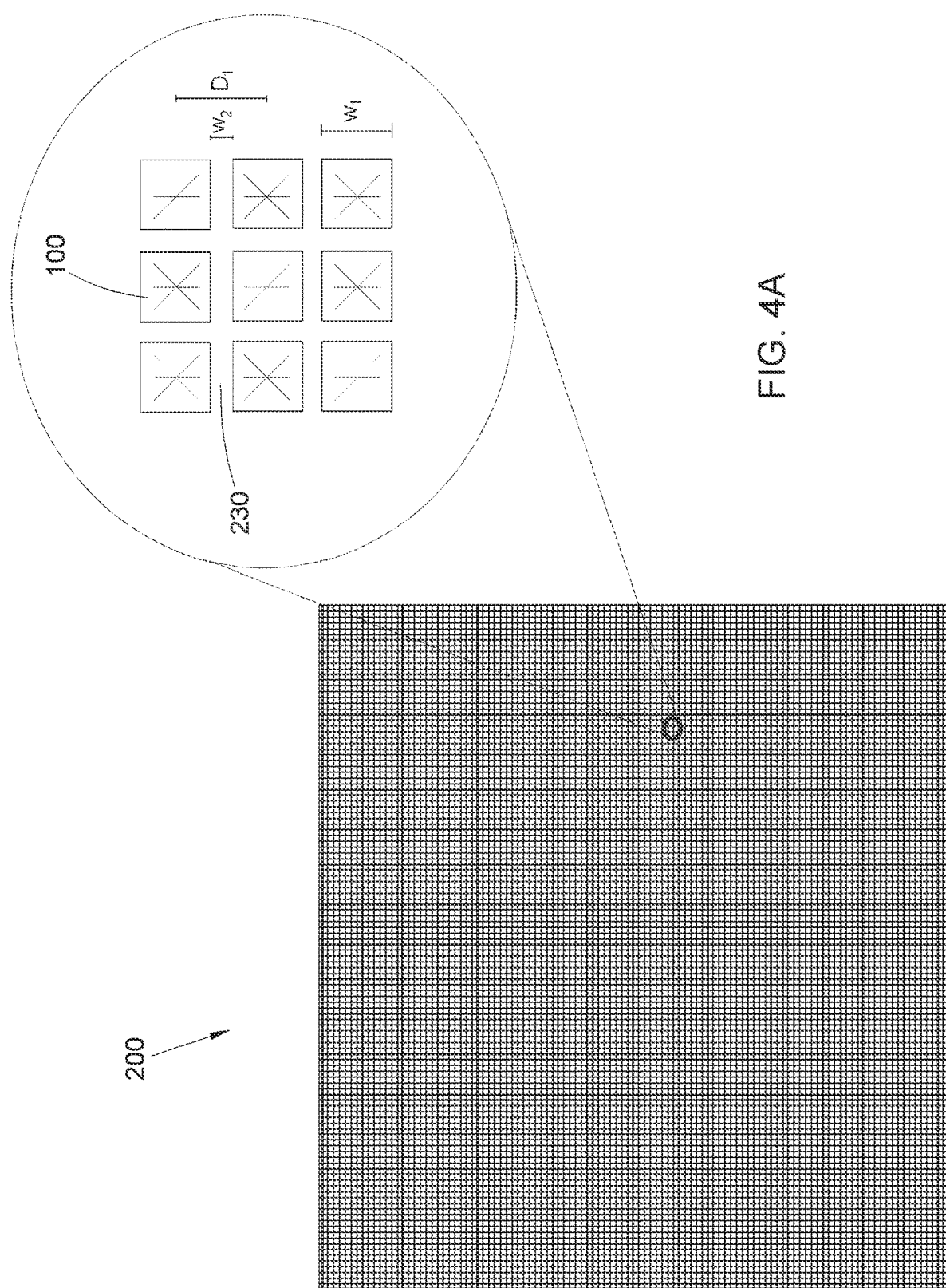
FIG. 4A shows a top schematic view of an example miniLED or microLED array and an enlarged section of 3×3 LEDs of the array.

Although FIGS. 2A and 2B show a 3×3 array of nine pcLEDs, such arrays may include for example on the order of $10^1$, $10^2$, $10^3$, $10^4$, or more LEDs, e.g., as illustrated schematically in FIG. 4A. Individual LEDs 100 (i.e., pixels) may have widths $w_1$ (e.g., side lengths) in the plane of the array 200, for example, less than or equal to 1 millimeter (mm), less than or equal to 500 microns, less than or equal to 100 microns, or less than or equal to 50 microns. LEDs 100 in the array 200 may be spaced apart from each other by streets, lanes, or trenches 230 having a width $w_2$ in the plane of the array 200 of, for example, hundreds of microns, less than or equal to 100 microns, less than or equal to 50 microns, less than or equal to 20 microns, less than or equal to 10 microns, or less than or equal to 5 microns. The pixel pitch or spacing $D_1$ is the sum of $w_1$ and $w_2$. Although the illustrated examples show rectangular pixels arranged in a symmetric matrix, the pixels and the array may have any suitable shape or arrangement, whether symmetric or asymmetric. Multiple separate arrays of LEDs can be combined in any suitable arrangement in any applicable format to form a larger combined array or display.

LEDs having dimensions $w_1$ in the plane of the array (e.g., side lengths) of less than or equal to about 0.10 millimeters microns are typically referred to as microLEDs, and an array of such microLEDs may be referred to as a microLED array. LEDs having dimensions $w_1$ in the plane of the array (e.g., side lengths) of between about 0.10 millimeters and about 1.0 millimeters are typically referred to as miniLEDs, and an array of such miniLEDs may be referred to as a miniLED array.

Figure 4B:
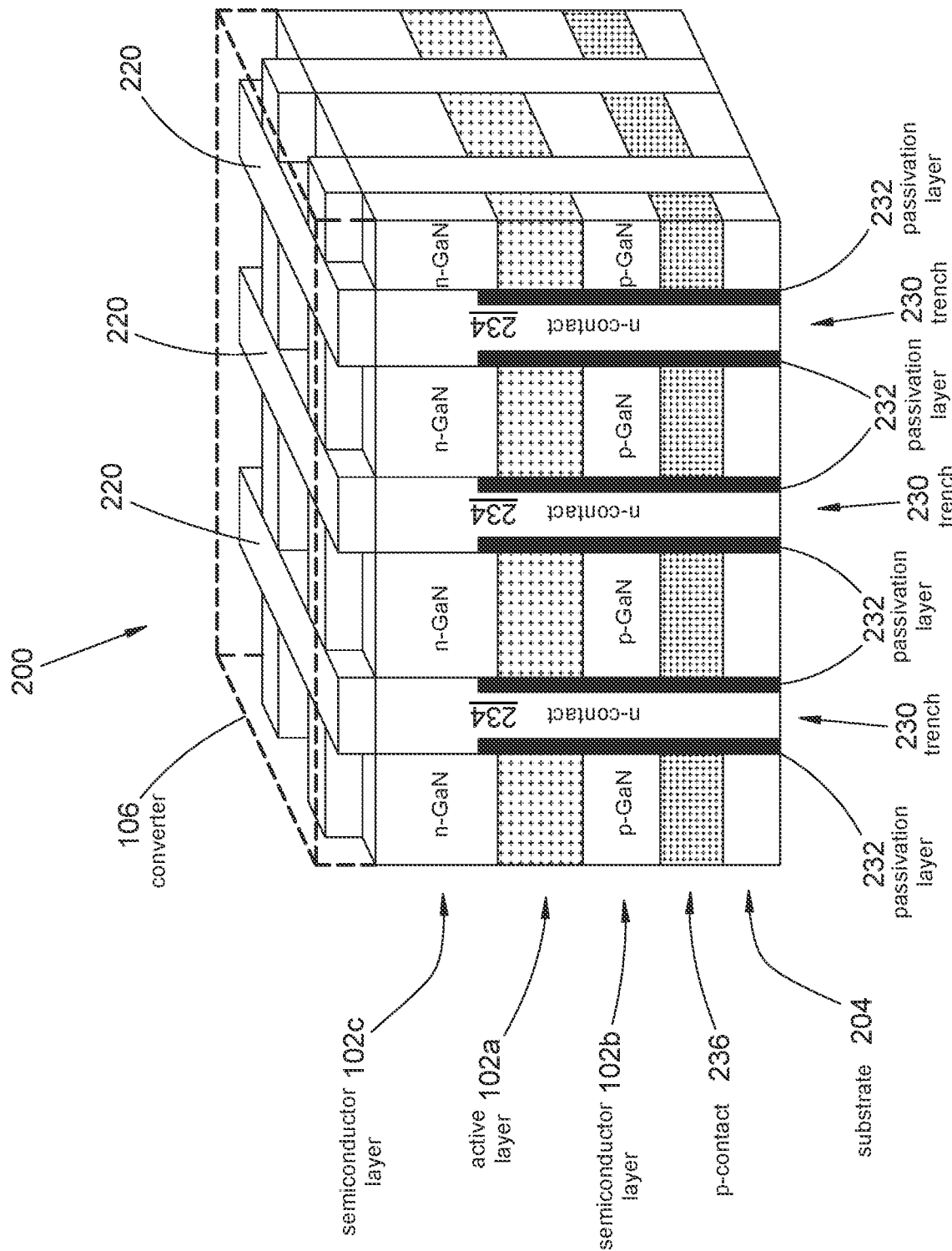
FIG. 4B shows a perspective view of several LEDs of an example pc-miniLED or pc-microLED array monolithically formed on a substrate.

An array of LEDs, miniLEDs, or microLEDs, or portions of such an array, may be formed as a segmented monolithic structure in which individual LED pixels are electrically isolated from each other by trenches and or insulating material. FIG. 4B shows a perspective view of an example of such a segmented monolithic LED array 200. Pixels in this array (i.e., individual semiconductor LED devices 102) are separated by trenches 230 which are filled to form n-contacts 234. The monolithic structure is grown or disposed on the substrate 204. Each pixel includes a p-contact 236, a p-GaN semiconductor layer 102b, an active region 102a, and an n-GaN semiconductor layer 102c; the layers 102a/102b/102c collectively form the semiconductor LED 102. A wavelength converter material 106 may be deposited on the semiconductor layer 102c (or other applicable intervening layer). Passivation layers 232 may be formed within the trenches 230 to separate at least a portion of the n-contacts 234 from one or more layers of the semiconductor. The n-contacts 234, other material within the trenches 230, or material different from material within the trenches 230 may extend into the converter material 106 to form complete or partial optical isolation barriers 220 between the pixels.

Figure 4C:
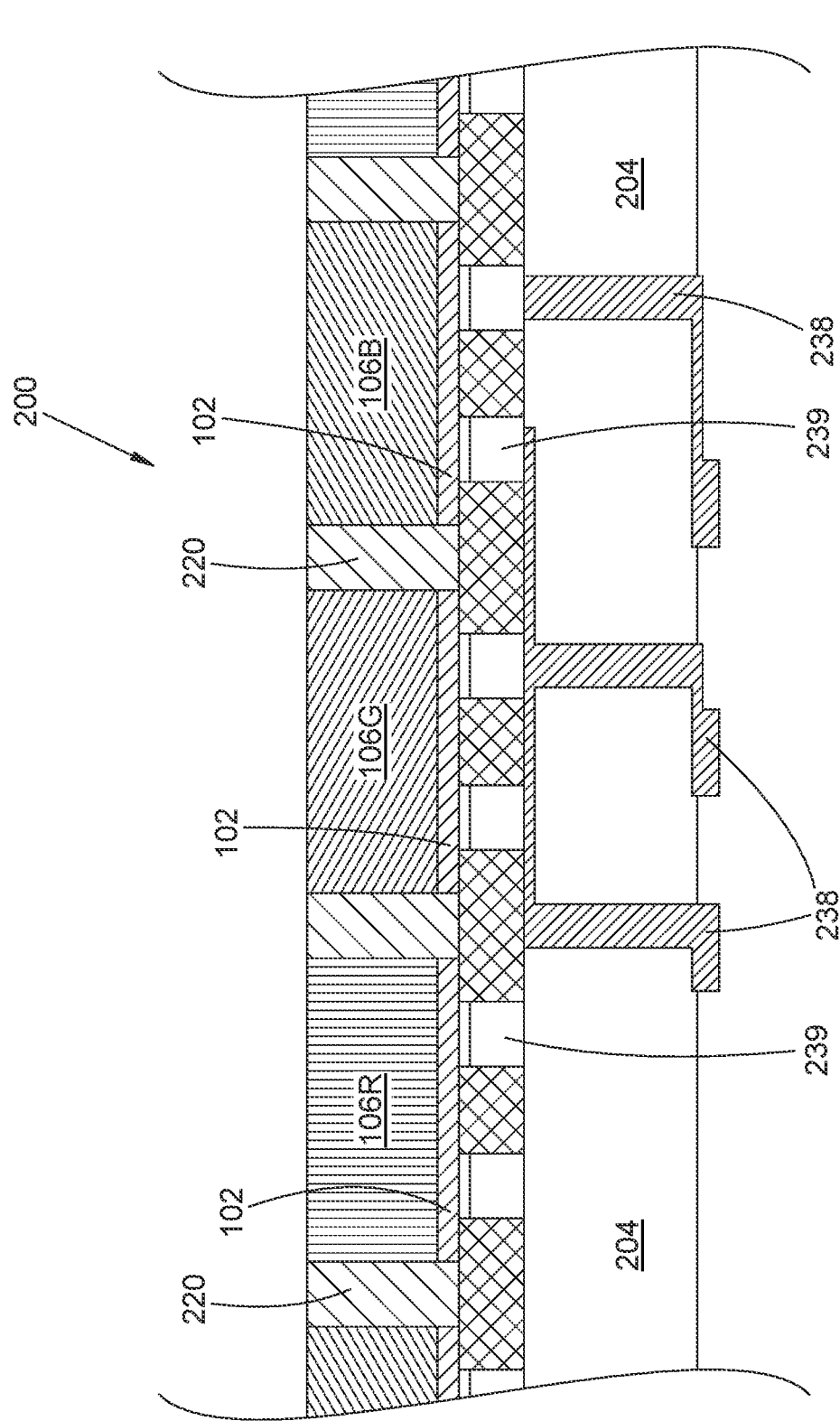
FIG. 4C is a side cross-sectional schematic diagram of an example of a close-packed array of multi-colored phosphor-converted LEDS on a monolithic die and substrate.

FIG. 4C is a schematic cross-sectional view of a close packed array 200 of multi-colored, phosphor converted LEDs 100 on a monolithic die and substrate 204. The side view shows GaN LEDs 102 attached to the substrate 204 through metal interconnects 239 (e.g., gold-gold interconnects or solder attached to copper micropillars) and metal interconnects 238. Phosphor pixels 106 are positioned on or over corresponding GaN LED pixels 102. The semiconductor LED pixels 102 or phosphor pixels 106 (often both) can be coated on their sides with a reflective mirror or diffusive scattering layer to form an optical isolation barrier 220. In this example each phosphor pixel 106 is one of three different colors, e.g., red phosphor pixels 106R, green phosphor pixels 106G, and blue phosphor pixels 106B (still referred to generally or collectively as phosphor pixels 106). Such an arrangement can enable use of the LED array 200 as a color display.

The individual LEDs (pixels) in an LED array may be individually addressable, may be addressable as part of a group or subset of the pixels in the array, or may not be addressable. Thus, light emitting pixel arrays are useful for any application requiring or benefiting from fine-grained intensity, spatial, and temporal control of light distribution. These applications may include, but are not limited to, precise special patterning of emitted light from pixel blocks or individual pixels, in some instances including the formation of images as a display device. Depending on the application, emitted light may be spectrally distinct, adaptive over time, and/or environmentally responsive. The light emitting pixel arrays may provide preprogrammed light distribution in various intensity, spatial, or temporal patterns. The emitted light may be based at least in part on received sensor data and may be used for optical wireless communications. Associated electronics and optics may be distinct at a pixel, pixel block, or device level.

FIGS. 5A and 5B are examples of LED arrays 200 employed in display applications, wherein an LED display includes a multitude of display pixels. In some examples (e.g., as in FIG. 5A), each display pixel comprises a single semiconductor LED pixel 102 and a corresponding phosphor pixel 106R, 106G, or 106B of a single color (red, green, or blue). Each display pixel only provides one of the three colors. In some examples (e.g., as in FIG. 5B), each display pixel includes multiple semiconductor LED pixels 102 and multiple corresponding phosphor pixels 106 of multiple colors. In the example shown each display pixel includes a 3×3 array of semiconductor pixels 102; three of those LED pixels have red phosphor pixels 106R, three have green phosphor pixels 106G, and three have blue phosphor pixels 106B. Each display pixel can therefore produce any desired color combination. In the example shown the spatial arrangement of the different colored phosphor pixels 106 differs among the display pixels; in some examples (not shown) each display pixel can have the same arrangement of the different colored phosphor pixels 106.

As shown in FIGS. 6A and 6B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

A pixel spacing and pixel separation decrease, fabrication of an array becomes more problematic. Maintaining adequate contrast ratio between adjacent pixels of an array can be challenging. As described above and elsewhere, light barriers of various sorts are sometimes employed between at least portions of adjacent pixels. Those barriers can be positioned between adjacent semiconductor LEDs of an array, between adjacent phosphor converters of the arrays, or both. In many examples a light barrier is formed within a deep, narrow trench between adjacent pixels of the array. A narrow width and high aspect ratio (e.g., less than 10 μm and greater than 10:1) can make formation of a light barrier in that trench difficult. In some cases the barrier material might not reach the bottom of the trench.

It would therefore be desirable to provide reliable methods for making thin inter-pixel light barriers with high aspect ratio. It would be desirable to provide such barriers in a pixelated wavelength-conversion layer that includes regions of three distinct materials, e.g., in a RGB pixel arrangement.

Subject matter disclosed herein may be related to U.S. Pat. No. 10,930,825 entitled "Two step phosphor deposition to make a matrix array" issued Feb. 23, 2021 to Bohmer et al, that patent being incorporated herein by reference in its entirety.

Figure 7A:
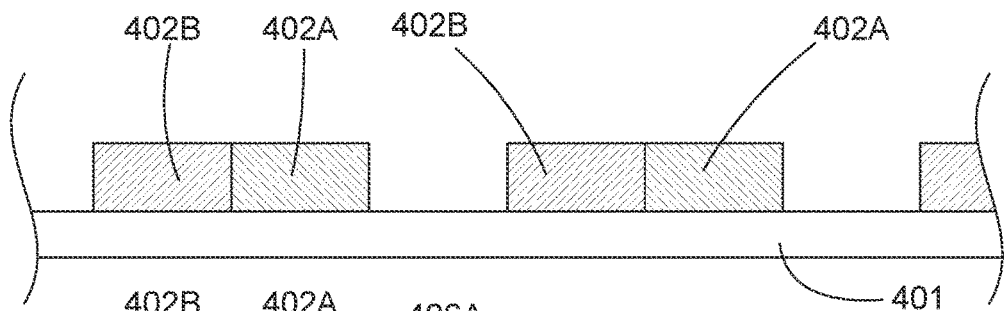
FIGS. 7A-7K and 8A-8K are side cross-sectional and plan views schematically illustrating an inventive fabrication sequence for a wavelength-conversion layer.

An example of an inventive method for making a wavelength-conversion layer 400 that includes pixel regions of three different types is illustrated schematically in FIGS. 7A-7K and 8A-8K. A substrate 401 is patterned with mask materials 402A and 402B. As shown in FIGS. 7A and 8A, a first set of pixel areas of the surface of the substrate is left unmasked, while a second set of pixel areas is masked by the mask material 402A, and a third set of pixel areas is masked by the mask material 402B. The sets of first, second, and third pixel areas contiguously fill at least a portion of the substrate surface.

In some examples the substrate can be provided with mask materials 402A/402B already patterned on the substrate surface. In some examples the method can include forming, growing, or depositing the mask materials 402A/402B on the second and third sets of pixel regions on the surface of the substrate 401. Any one or more suitable techniques can be employed for masking the second and third sets of pixel regions, e.g., spin coating, blade coating, spray coating, photolithography, beam deposition or etching, and so forth. In some examples, a first mask material is deposited and patterned, and then a second mask material is deposited, patterned, and planarized.

Figure 7B:
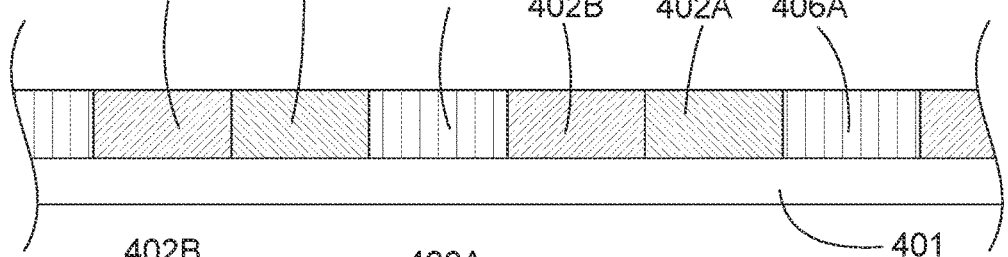
Figure 8A:
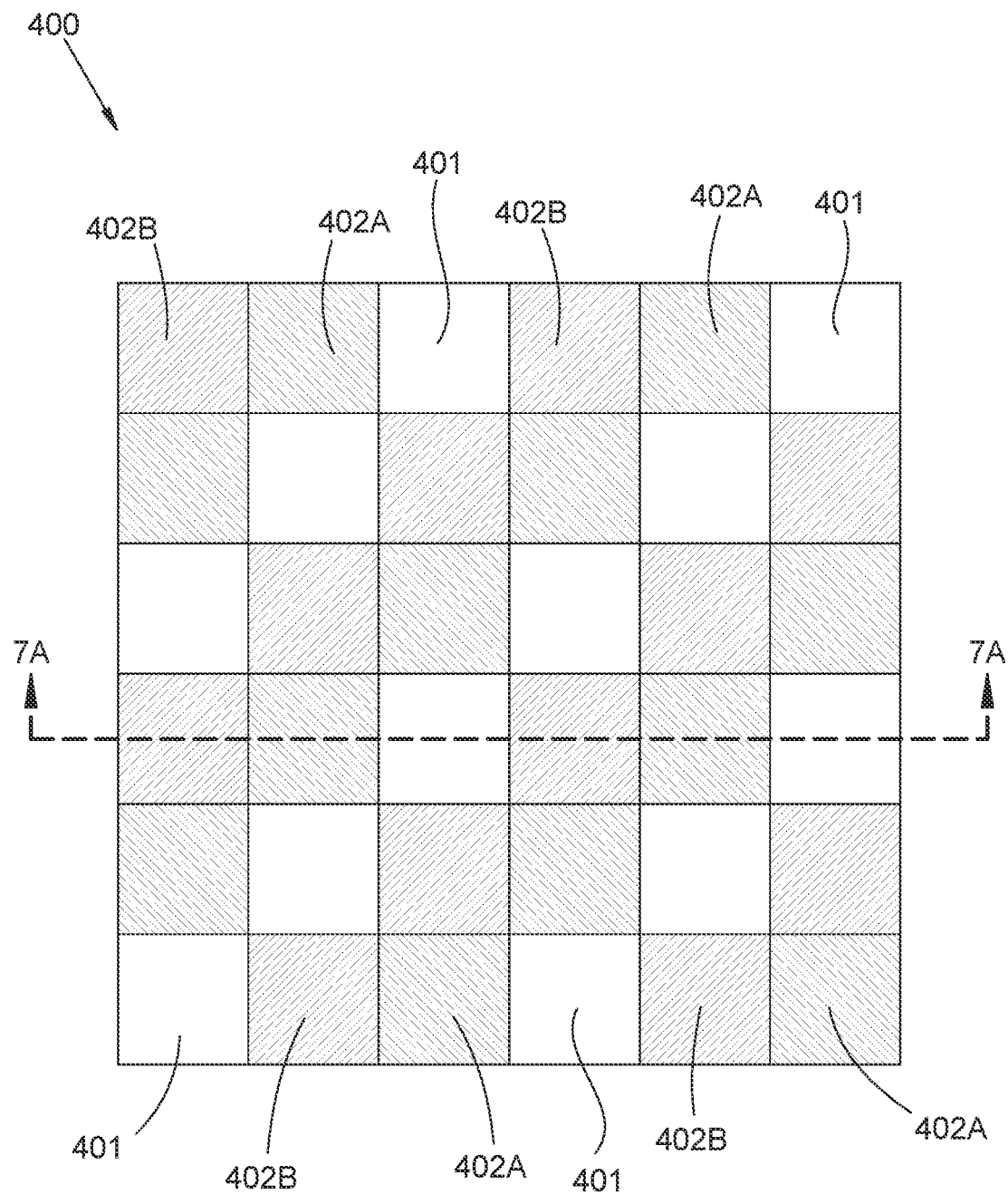
Figure 8B:
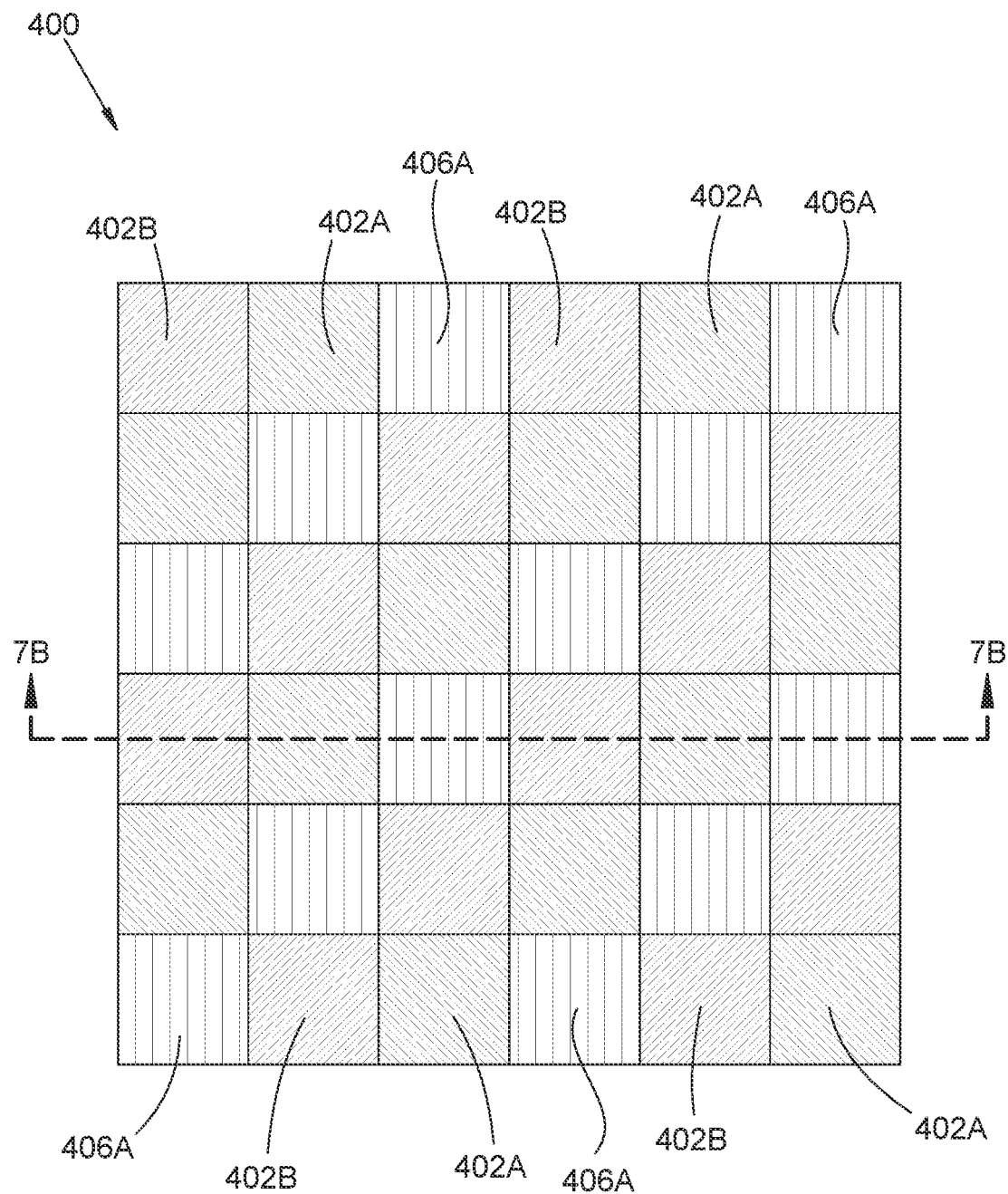

A first conversion layer material 406A is formed, grown, or deposited on the unmasked pixel regions, as shown in FIGS. 7B and 8B. Each conversion layer material 406A, 406B, or 406C can include a corresponding phosphor for absorbing light at a first wavelength and in turn emitting down-converted light at a corresponding longer wavelength; at least two among the first, second, and third conversion layer materials 406A, 406B, and 406C are wavelength-converting phosphor materials. In some examples all the conversion layer materials 406A/B/C are phosphors; in some examples two of those materials are phosphors while the other is transparent at the first wavelength and does not emit down-converted light. Any suitable phosphor type can be employed, and can be formed in any suitable way under any suitable conditions. In some examples, forming, growing, or depositing one or more of the first, second, or third conversion layer materials can include one or more of blade coating, spray coating, drop dispensing, particle aggregation or self-assembly, ALD or CVD of a binder coating onto phosphor particles, or other suitable methods. In some examples, forming, growing, or depositing one or more of the first, second, or third conversion layer materials can include curing that conversion layer material. In some of those examples, the curing being carried out for 2 hours or less at temperatures that remain below 130° C., so as to reduce the likelihood of degrading the mask, or over-baking the mask and making it more difficult to remove later.

In some examples the formation of the conversion layer material 406A leaves no material on top of the mask materials 402A and 402B. In other examples some of the material 406A might be left on the mask materials, and can in some instances require removal (e.g., by grinding, polishing, or other planarization technique) before proceeding with subsequent steps.

Figure 7C:
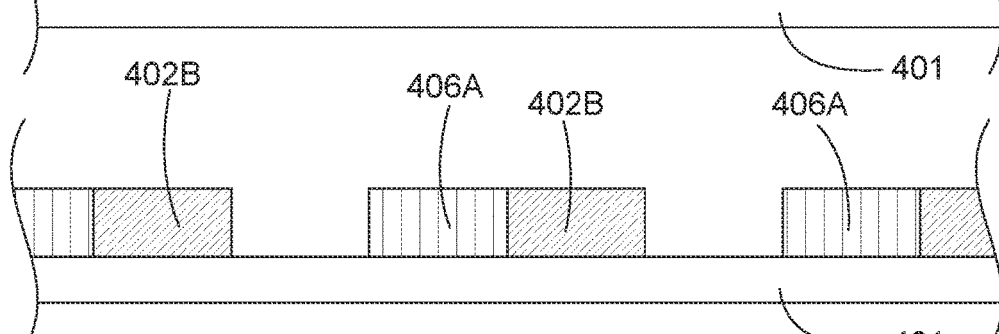
Figure 8C:
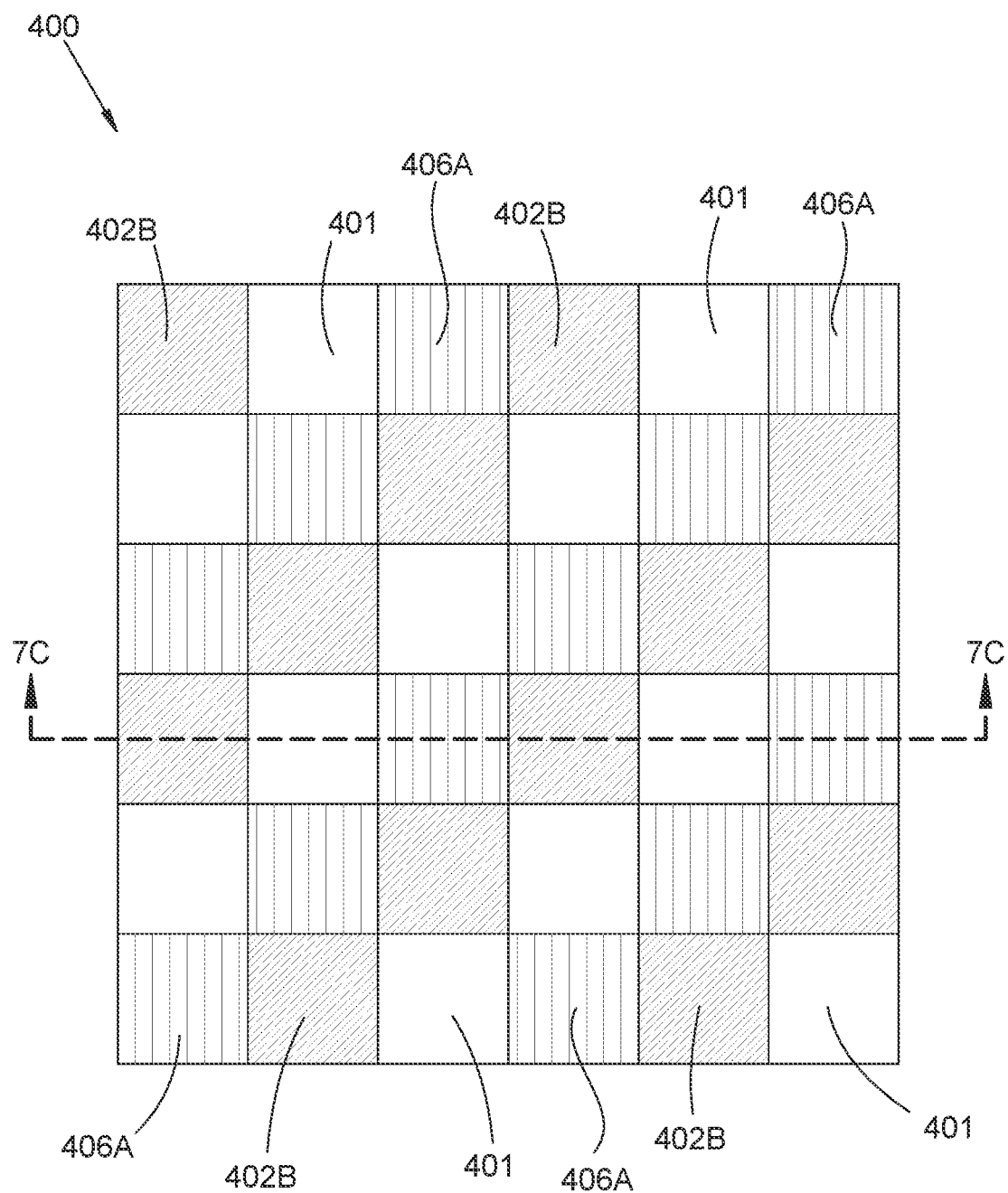

After the conversion layer material 406A is formed in the first pixel areas, the mask material 402A is removed from the second pixel regions while leaving the third set of pixel regions still masked by the mask material 402B (as in FIGS. 7C and 8C). In some examples, the mask materials 402A and 402B can be the same mask material, and the mask material 402A can be removed from only the second pixel areas using one or more spatially selective material removal techniques (e.g., beam etching). Perhaps more commonly, in some examples the mask materials 420A and 402B can be different mask materials, often chosen so that the mask material 402A can be removed from the substrate 401 under conditions that leave the mask material 402B intact on the third set of pixel areas. In some examples the mask material 402A can be removed using a stripping procedure to which the mask material 402B is relatively resistant. In some examples the mask material 402A can be removed by treatment with one or more solvents, e.g., dimethyl sulfoxide (DMSO), N-methyl-2-pyrrolidone (NMP), a commercially available stripper such as TechniStrip®, or other suitable solvents. In some examples the mask material 402A can include a positive photoresist material (typically relative susceptible to solvent stripping), while the mask material 402B can include a negative photoresist material (typically relatively resistant to solvent stripping).

Figure 7D:
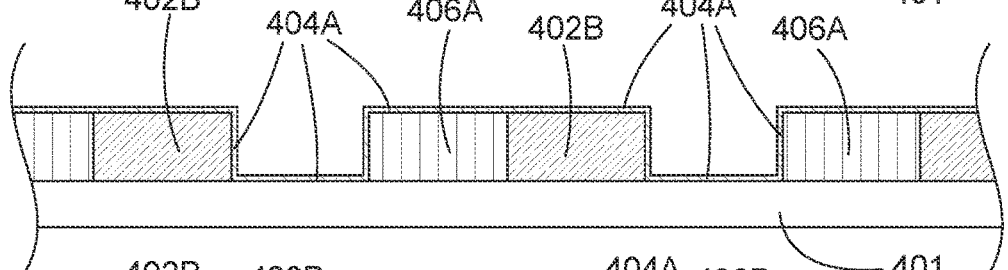
Figure 7E:
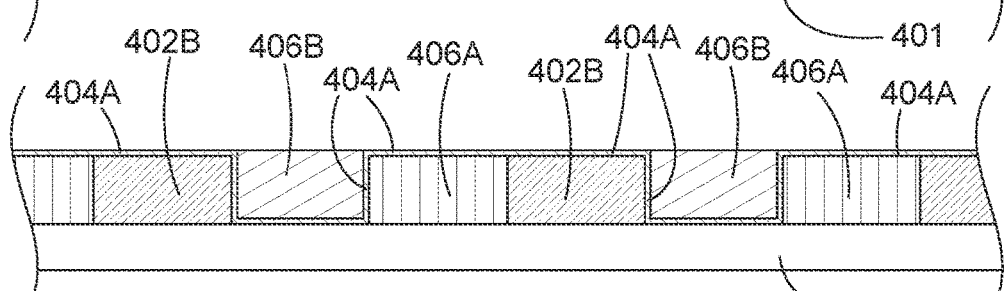
Figure 7F:
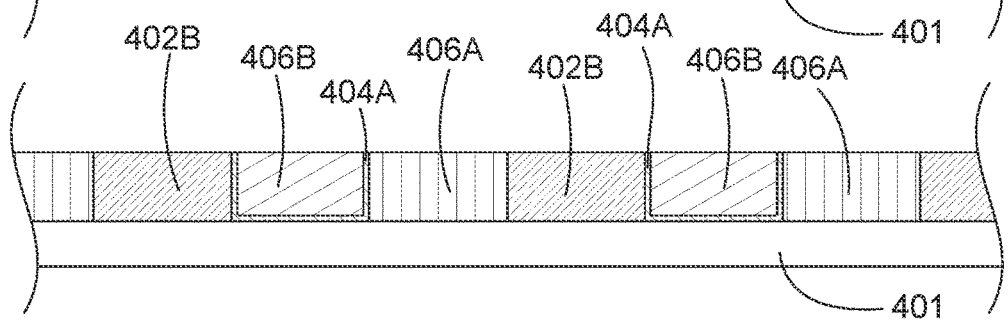
Figure 7G:
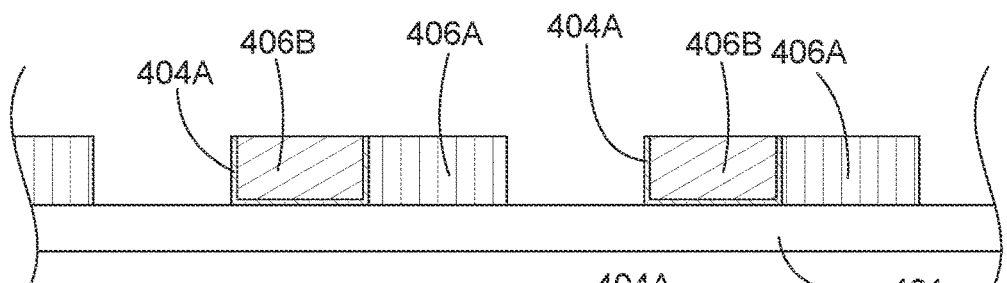
Figure 7H:
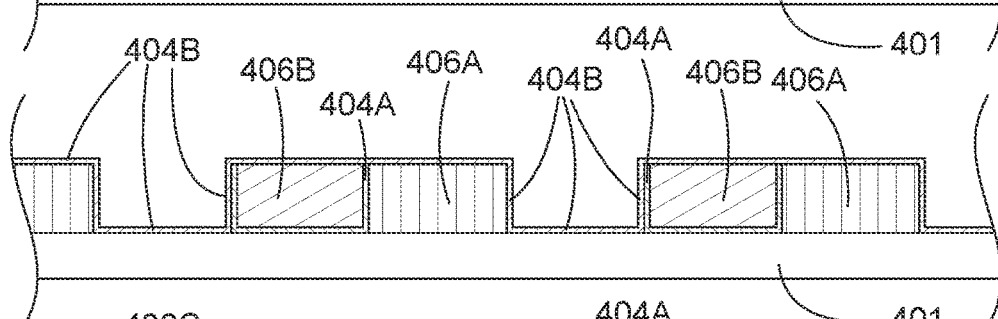
Figure 8D:
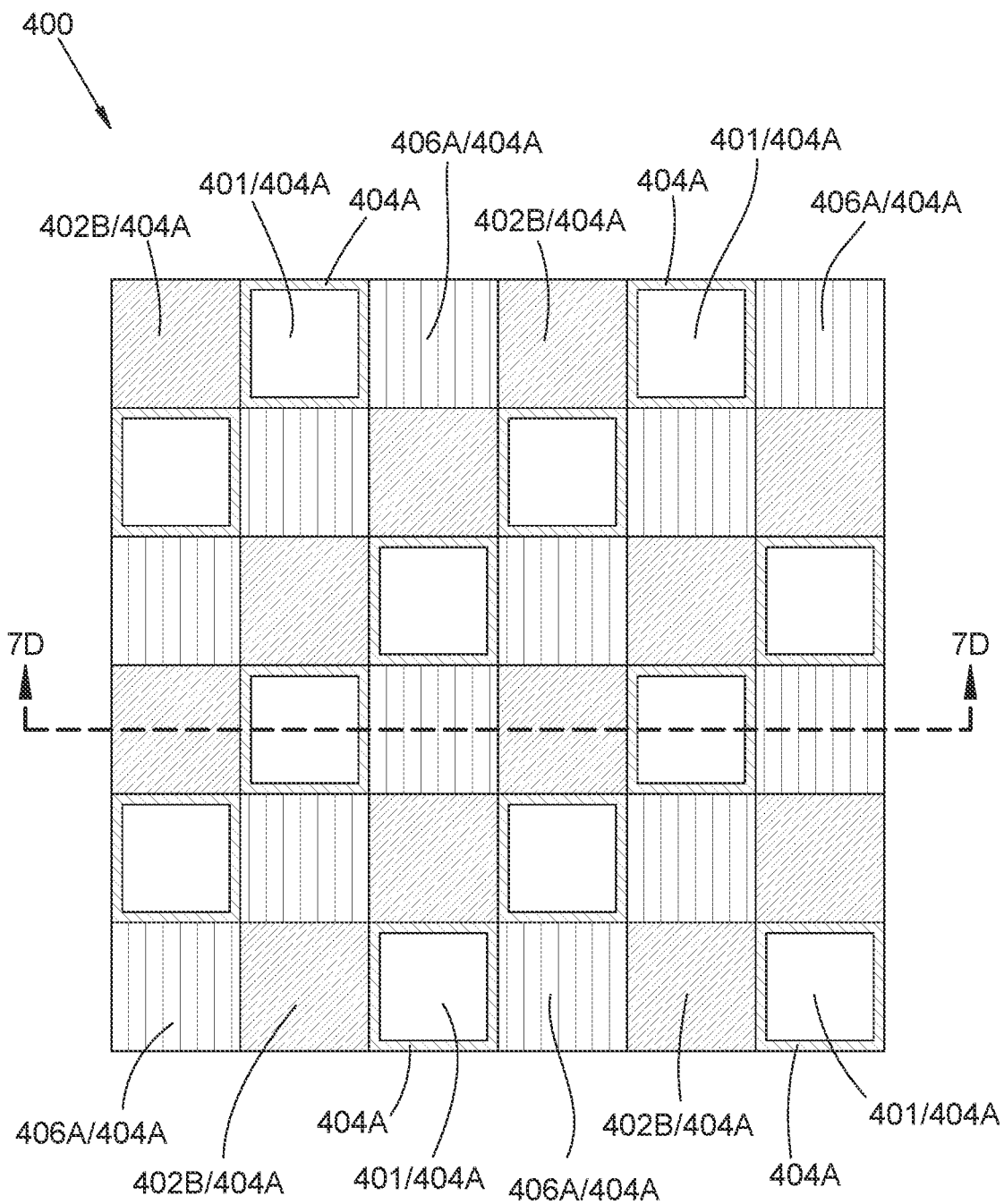
Figure 8E:
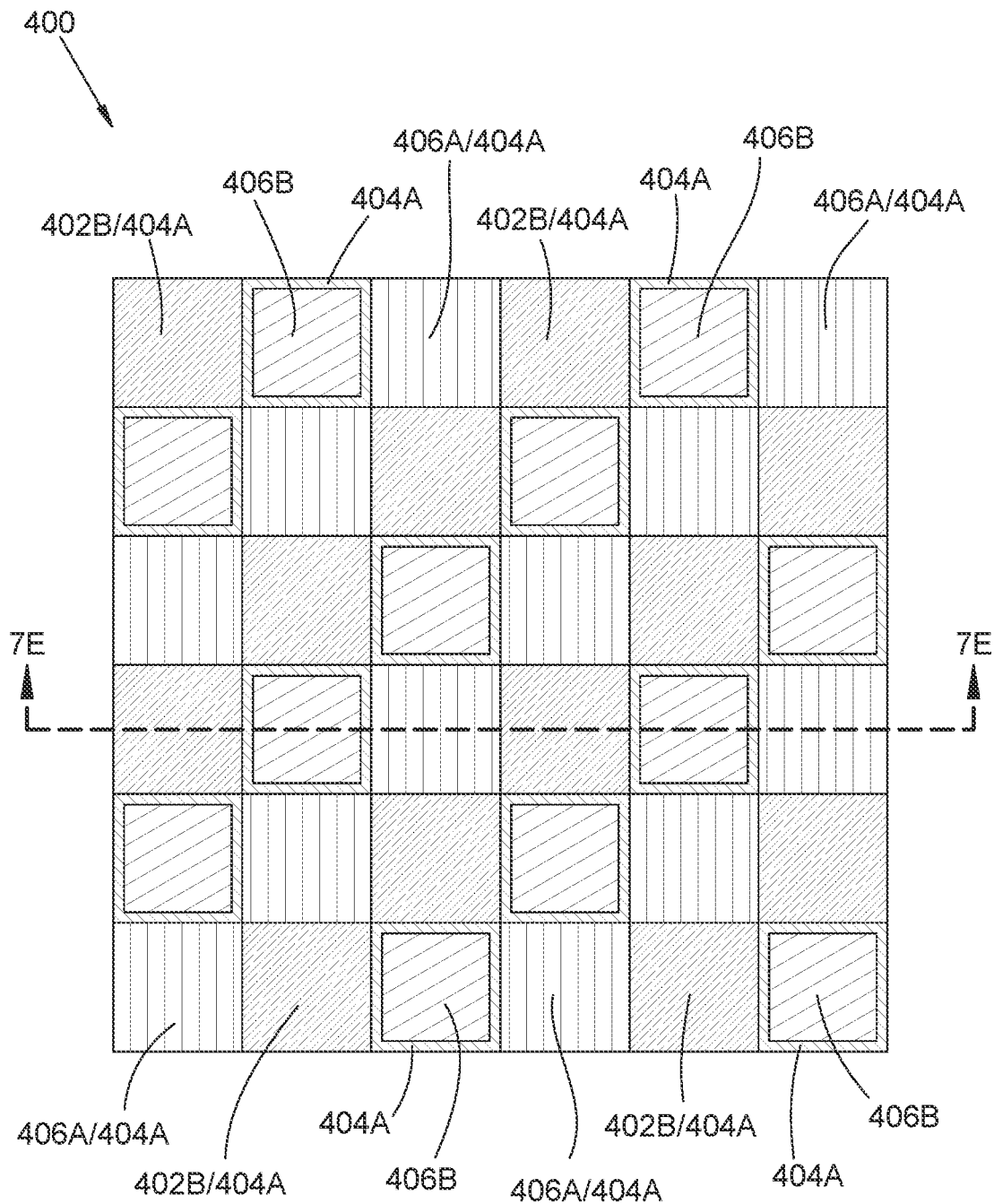
Figure 8F:
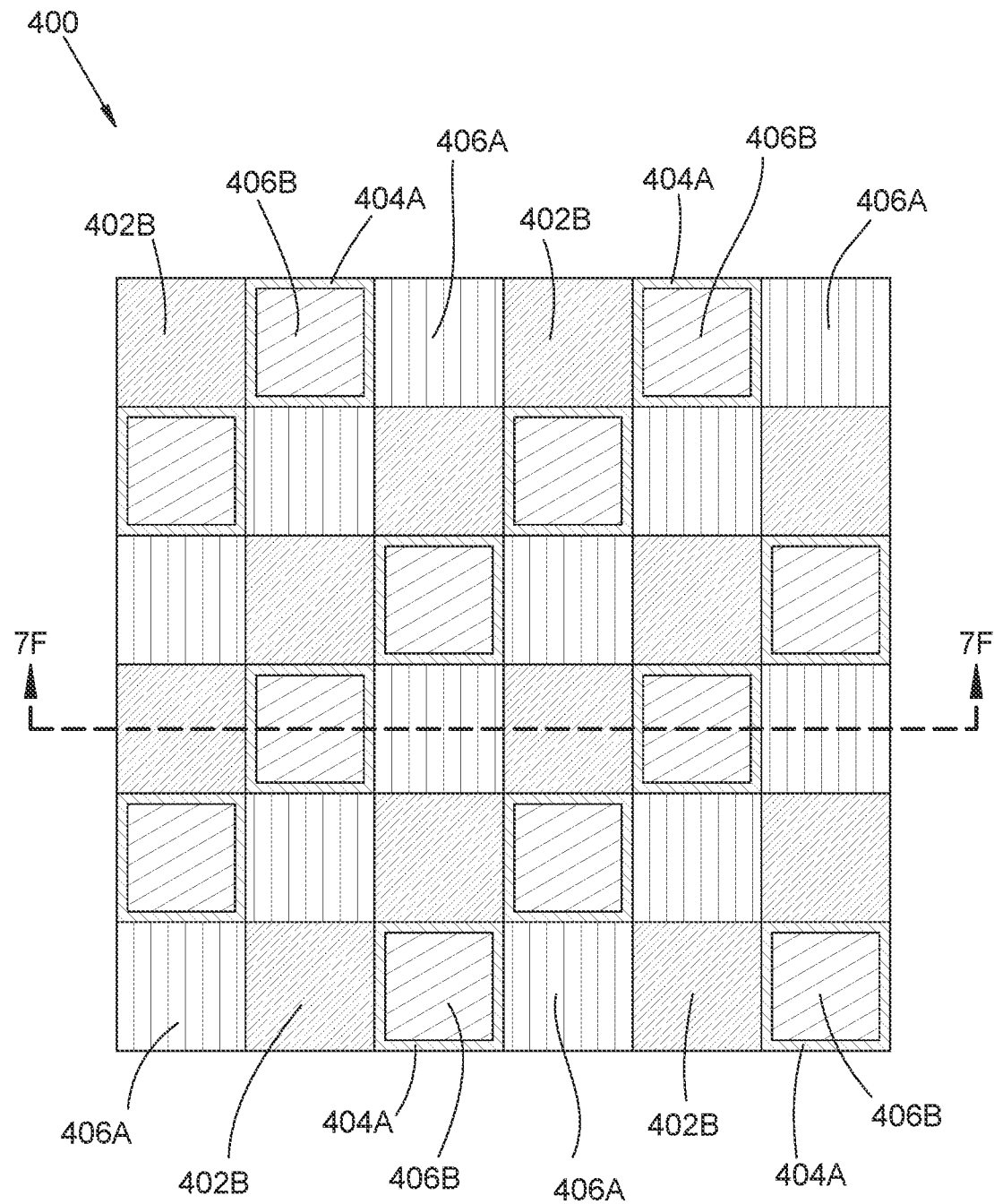
Figure 8G:
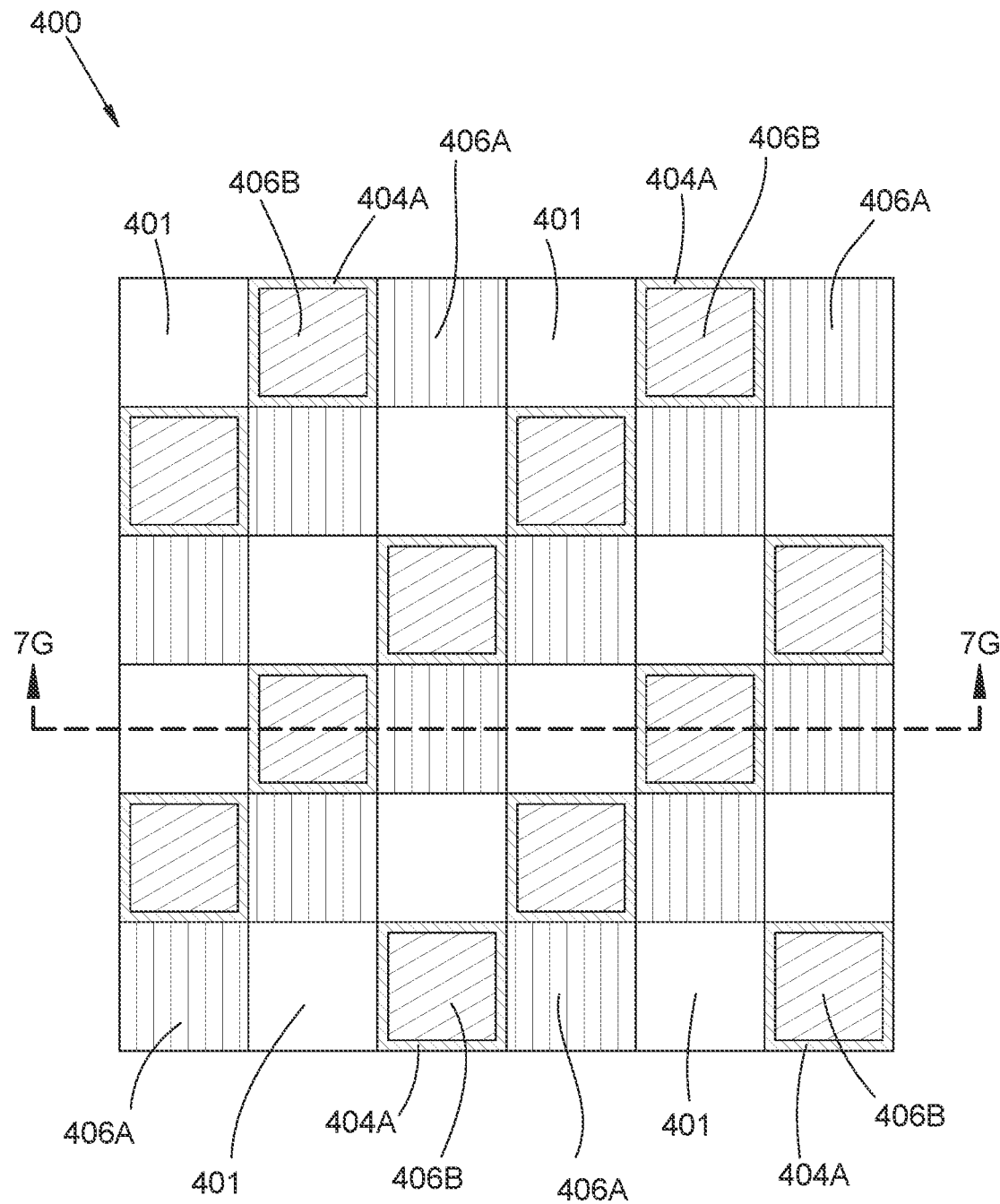
Figure 8H:
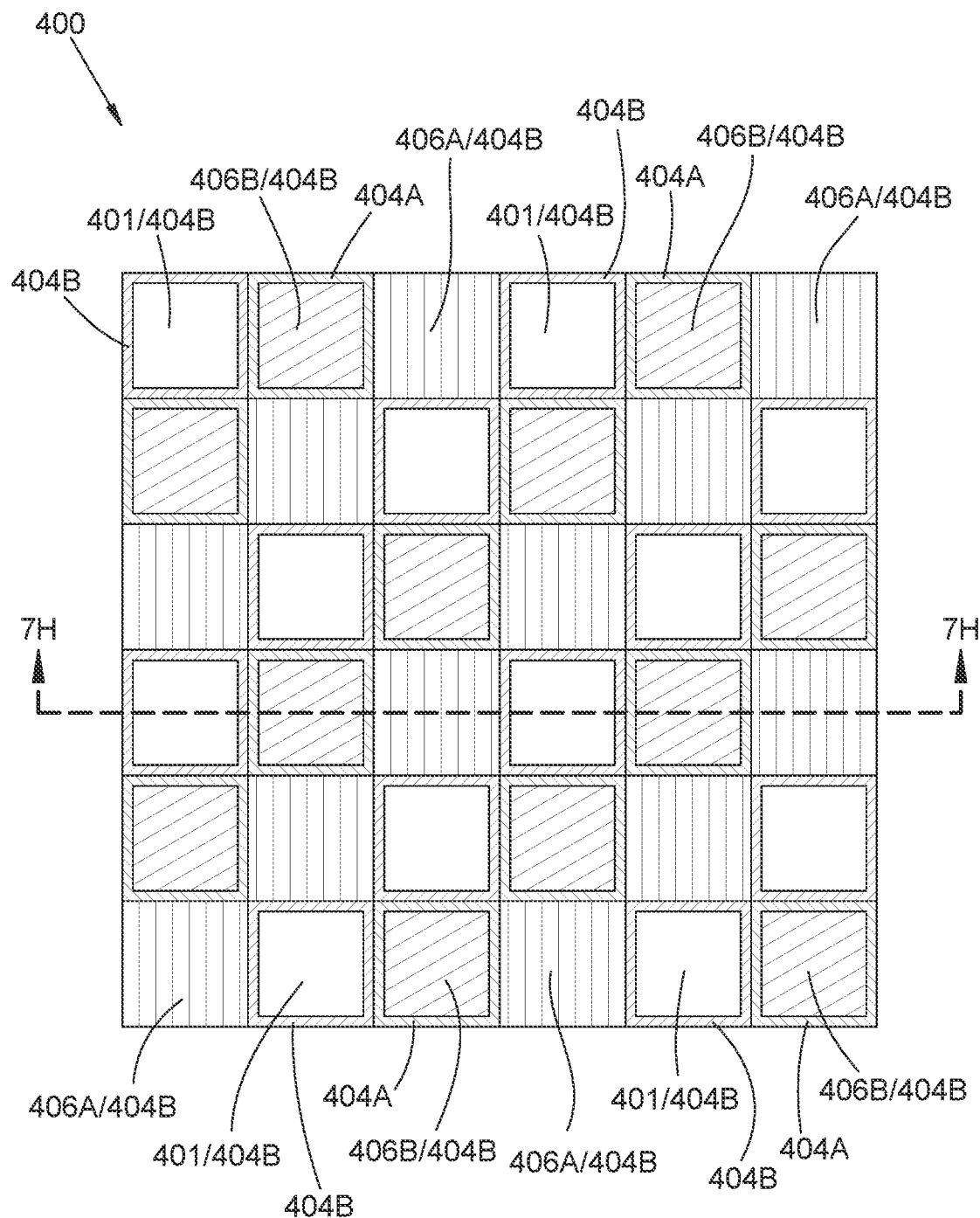

After removal of the mask material 402A from the second set of pixel areas, a first sidewall layer 404A is formed, grown, or deposited on exposed side surfaces of both the regions of the first conversion layer material 406A and the mask material 402B remaining on the third pixel areas (e.g., as in FIGS. 7D and 8D). Those side surfaces are left exposed by the removal of mask material 402A from the second pixel areas. A second conversion layer material 406B, different from the first conversion layer material 406A, is then formed, grown, or deposited on the second pixel areas (e.g., as in FIGS. 7E and 8E). Each side surface of the second conversion layer material 406B is positioned against the first sidewall layer 404A. The second conversion layer material 406B can be formed in any suitable way or under any suitable conditions, including those described above.

In some examples the formation of the conversion layer material 406B leaves no material on top of the conversion layer material 406A or the mask material 402B (and the sidewall material 404A on them). In other examples some of the material 406B might be left on those other materials, and can in some instances require removal (e.g., by grinding, polishing, or other planarization technique) before proceeding with subsequent steps. In some examples, before proceeding the sidewall material 404A can be removed from on top of the conversion layer material 406A and the mask material 402B (e.g., as in FIGS. 7F and 8F). The sidewall material 404A can be removed in any suitable way, including those described above.

The mask material 402B is then removed from the third pixel areas using any suitable technique(s). In some examples the mask material 402B can be removed by plasma etching or plasma ashing. Removal of the mask material 402B leaves exposed some side surfaces of conversion layer material 406A, and sidewall material 404A on some side surfaces of conversion layer material 406B (e.g., as in FIGS. 7G and 8G). A second sidewall material 404B is then deposited to cover those exposed side surfaces (e.g., as in FIGS. 7H and 8H).

Figure 7I:
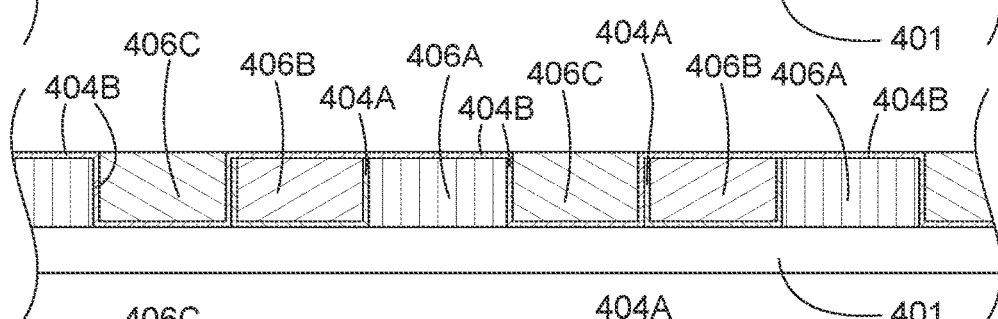
Figure 8I:
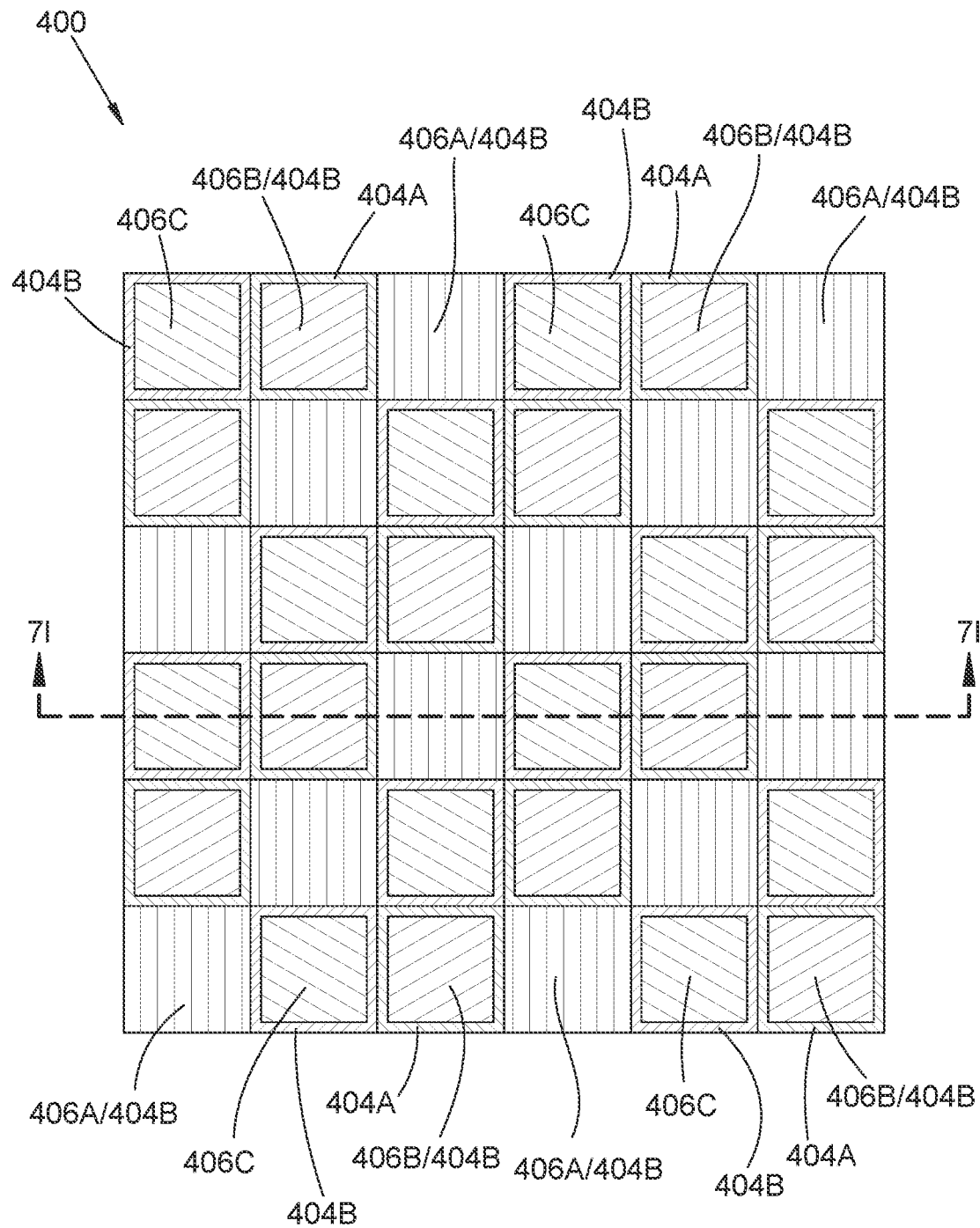

A third conversion layer material 406C, different from the first and second conversion layer materials 406A/406B, is formed, grown, or deposited in the pixel areas of the third set (e.g., as in FIGS. 7I and 8I). The deposited material 406C is positioned against the second sidewall layer 404B. The third conversion layer material 406C can be formed in any suitable way or under any suitable conditions, including those described above. The regions of the first, second, and third conversion layer materials 406A, 406B, and 406C, with sidewall material 404A and 404B between them, form a wavelength-conversion layer 400.

Figure 7J:
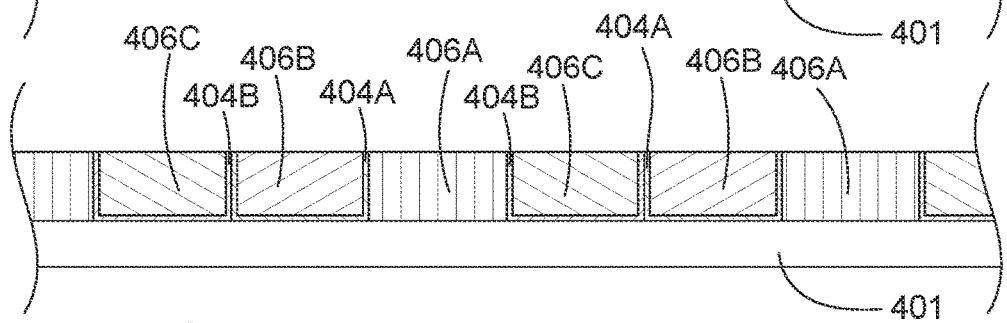
Figure 7K:
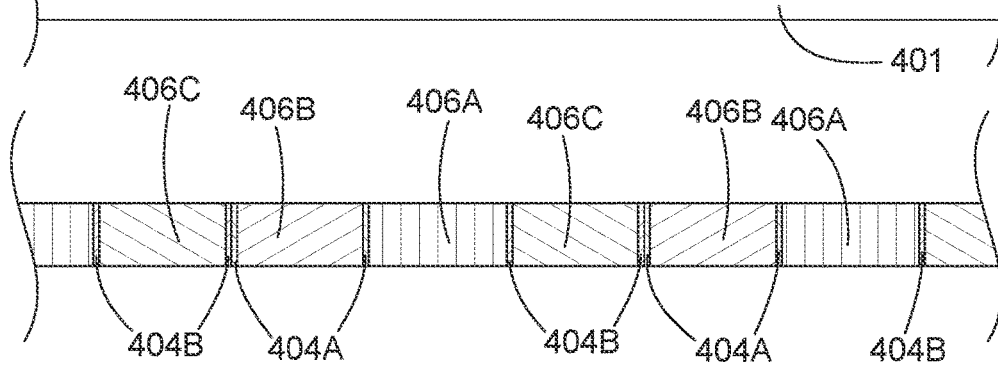
Figure 8J:
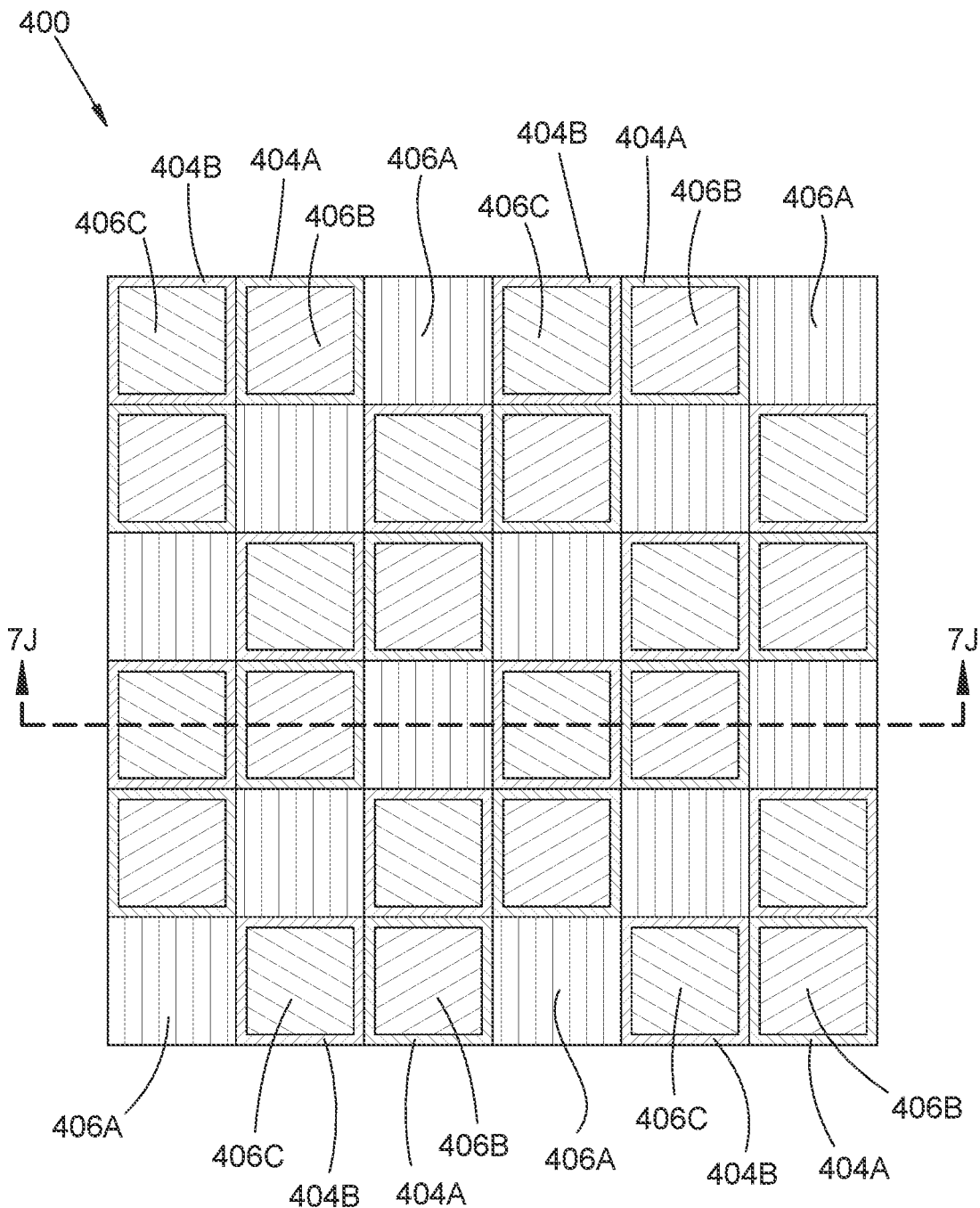
Figure 8K:
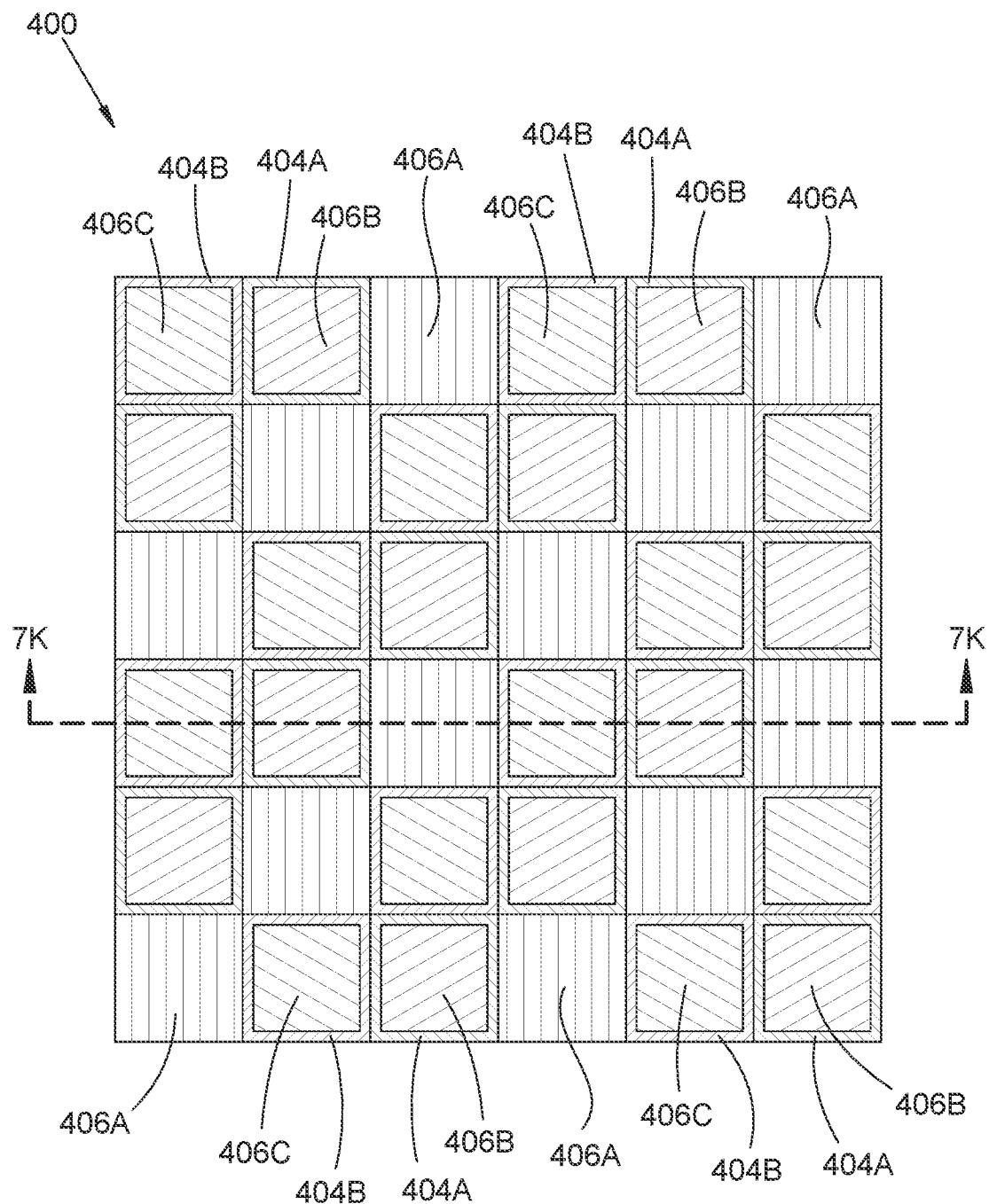

Sidewall material 404B, and any conversion layer material 406C left on the tops of the conversion material 406A and 406B, can be removed in any suitable way (e.g., by grinding, polishing, or other planarization technique) so that light can enter and exit the wavelength-conversion layer 400 (e.g., as in FIGS. 7J and 8J). Similarly, the substrate 401 and the sidewall material 404A and 404B on the bottoms of the conversion layer materials 406B and 406C can be removed in any suitable way, as described above.

An inventive wavelength-conversion layer 400 resulting from the above procedure includes a set of multiple regions of the first conversion layer material 406A, a set of multiple regions of the second conversion layer material 406B, and a set of multiple regions of the third conversion layer material 406C. Those three sets of regions are contiguously arranged in a single wavelength-conversion layer 400, each region of the material 406A, 406B, and 406C extending entirely through the layer 400. At least two among the first, second, and third conversion layer materials 406A, 406B, and 406C are wavelength-converting phosphor materials. The layer 400 also includes a set of sidewall layers 404A and 404B, one or both of which are positioned between each pair of adjacent regions against the respective conversion materials of those regions. The sidewall layers 404A/404B reduce transmission of light between adjacent regions of the conversion layer materials, and each sidewall layer extends entirely through the layer 400.

In some examples the first, second, and third conversion layer materials 406A, 406B, and 406C can include distinct first, second, and third wavelength-converting phosphor materials. Each of those phosphor materials can absorb light at a first wavelength and in turn emit corresponding down-converted light at different corresponding down-converted wavelengths. In some of those examples, the first, second, and third conversion layer materials can include a first wavelength-converting phosphor material that absorbs UV light and emits blue light, a second wavelength-converting phosphor material that absorbs UV light and emits green light, and a third wavelength-converting phosphor material that absorbs UV light and emits red light.

In some examples the first, second, and third conversion layer materials 406A, 406B, and 406C can include a first wavelength-converting phosphor material, a second wavelength-converting phosphor material, and a transparent material. Each wavelength-converting phosphor material can absorb light at a first wavelength and in turn emit corresponding down-converted light at different corresponding down-converted wavelengths, while the transparent material can be transparent at the first wavelength and emits no down-converted light. In some of those examples, the first, second, and third conversion layer materials can include a first wavelength-converting phosphor material that absorbs blue light and emits green light, a second wavelength-converting phosphor material that absorbs blue light and emits red light, and a transparent material that transmits blue light and emits no down-converted light.

As noted above, one purpose of the sidewall materials 404A and 404B is to reduce transmission of light between adjacent regions of the conversion layer materials. Such reduction of lateral transmission can reduce crosstalk between adjacent pixels of a light-emitting array that is used with the light-emitting layer 400.

In some examples the first or second sidewall layers 404A or 404B can be arranged as optical reflectors of any suitable type or arrangement. In some of those examples, the first or second sidewalls 404A or 404B can include one or more dielectric layers (e.g., arranged as a distributed Bragg reflector (DBR) or other multilayer reflector structure) or one or more metal layers (e.g., gold, silver, or aluminum). In some examples the first or second sidewall layers 404A or 404B can included one or more optical absorbers, such as one or more absorptive pigments. In some examples the first or second sidewall layers 404A or 404B can be arranged as optical scatterers, e.g., by inclusion of light scattering particles.

By forming the conversion layer materials 406B and 406C after forming the sidewall layers 404A and 404B, respectively, relatively thin layers with relatively large aspect ratios can be achieved between adjacent regions of conversion layer materials (i.e., between adjacent pixels of the pixelated wavelength-conversion layer 400). Adjacent pixel regions of the layer 400 are separated at most by only the combined thickness of the sidewall layers 404A and 404B. In some examples the first and second sidewall layers can have nonzero thickness that is less than 2.0 µm thick, less than 1.0 µm thick, less than 0.5 µm thick, less than 0.20 µm thick, less than 0.10 µm thick, or less than 0.05 µm thick. In some examples an aspect ratio of sidewall layer height to combined thickness of the first and second sidewall layers 404A and 404B (between the conversion layer materials 406B and 406C) is greater than 10:1, greater than 12:1, greater than 15:1, greater than 20:1, greater than 50:1, greater than 100:1, or greater than 300:1. Such large aspect ratios typically cannot be readily achieved by forming a trench between adjacent phosphor pixels and trying to form a light barrier within that trench.

Making the wavelength conversion layer 400 as described above can leave a telltale signature in the layer 400. A first subset of the sidewalls separates adjacent regions of the conversion layer materials 406A and 406B and includes only the first sidewall layer 404A; a second subset of the sidewalls separates adjacent regions of the conversion layer materials 406A and 406C and includes only the second sidewall layer 404B; a third subset of the sidewalls separates adjacent regions of the conversion layer materials 406B and 406C and includes both first and second sidewall layers 404A and 404B. If the sidewall layers 404A and 404B differ with respect to material composition or structure, those differences can be readily observed in the finished layer 400. Even if the same material(s) and structure are employed for both sidewall layers 404A and 404B, differing thickness between the third subset of sidewalls and the other two can be readily observed. In some examples, the sidewalls of the first and second subsets (i.e., only one or the other of the sidewall layers 404A or 404B) can have nonzero thickness that is less than 10%, less than 20%, less than 25%, less than 33%, less than 50%, about equal to 50%, less than 66%, less than 75%, less than 80%, or less than 90% of thickness of the sidewalls of the third subset (i.e. both sidewall layers 404A and 404B).

Figure 9A:
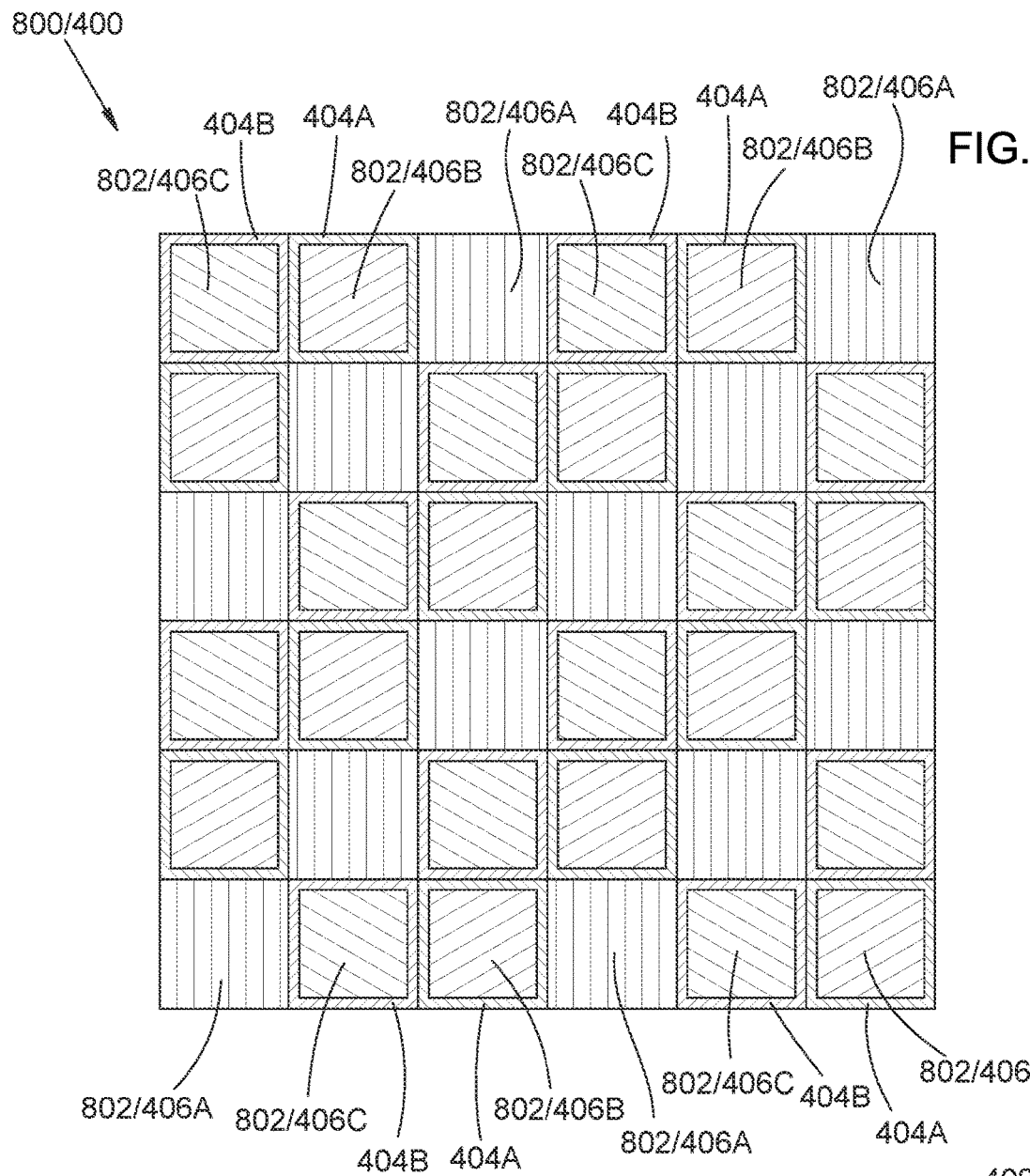
FIGS. 9A and 9B are schematic plan and side cross-sectional views of an example of an inventive wavelength-conversion layer in combination with an array of light-emitting pixels.
Figure 9B:
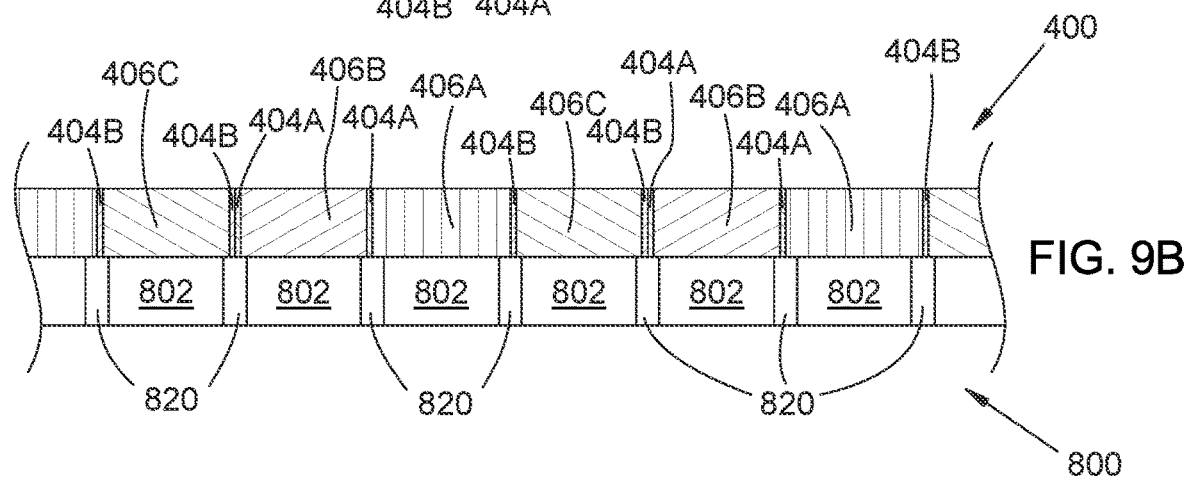

In some examples (e.g., as in FIGS. 9A and 9B), the pixelated wavelength-conversion layer 400 can be used in conjunction with an array 800 of light emitting pixels 802 (e.g., an array of semiconductor light-emitting diodes). In some examples the array 800 can include light barriers 820 of any suitable type or arrangement between the light-emitting pixels 802. The regions of the first, second, and third conversion layer materials 406A, 406B, and 406C can be arranged in the wavelength-conversion layer 400 as an array, and the array can have a nonzero spacing that is less than 1.0 mm, less than 0.50 mm, less than 0.33 mm, less than 0.20 mm, less than 0.10 mm, less than 0.08 mm, less than 0.05 mm, less than 0.033 mm, or less than 0.020 mm. The spacing of a light-emitting array 800 can have a pixel spacing that matches that of the wavelength-conversion layer 400. The wavelength-conversion layer 400 can be positioned facing an emission surface of the array 800 so that each light-emitting pixel 802 is aligned with a corresponding region of one of the conversion layer materials 406A, 406B, or 406C. In some examples, the substrate 401 and the portions of the sidewall layer materials 404A and 404B that were against the substrate can be removed before positioned the layer 400 on the array 800; in other examples, the substrate 401 and sidewall material 404A and 404B can be removed after positioning the layer 400 on the array 800.

In some examples each light-emitting pixel 802 of the array 800 can be operable independently of at least one other light-emitting pixel 802 of the array 800; in some examples each light-emitting pixel 802 of the array 800 can be operable independently of all other light-emitting pixels 802 of the array 800. In some examples the combined array 800 and wavelength-conversion layer 400 can exhibit a contrast ratio for light exiting adjacent regions of the wavelength-conversion layer 400 that is greater than 5:1, greater than 10:1, greater than 20:1, greater than 50:1, greater than 100:1, or greater than 300:1.

In some examples the first surface of the wavelength-conversion layer 400 can be positioned directly against a light-emitting surface of the light-emitting pixel array 800. In some other examples one or more transparent dielectric layers can be positioned between the wavelength-conversion layer 400 and a light-emitting surface of the light-emitting pixel array 800, with the first surface of the wavelength-conversion layer 400 being positioned against one of the dielectric layers.

In some examples the light-emitting pixels 802 can be arranged as the light-emitting diodes (LEDs) and can include one or more doped or undoped II-VI, or Group IV semiconductor materials or alloys or mixtures thereof. In some examples each light-emitting diode can include one or more p-n junctions, one or more quantum wells, one or more multi-quantum wells, or one or more quantum dots. In some examples the light emitted by the semiconductor light-emitting pixels 802 can have a vacuum wavelength greater than 0.20 μm, greater than 0.4 μm, greater than 0.8 μm, less than 10. μm, less than 2.5 μm, or less than 1.0 μm.

In addition to the preceding, the following example embodiments fall within the scope of the present disclosure or appended claims:

Example 1. A wavelength-conversion layer comprising: (a) a set of multiple regions of a first conversion layer material; (b) a set of multiple regions of a second conversion layer material; (c) a set of multiple regions of a third conversion layer material, the regions of the first, second, and third conversion layer materials being contiguously arranged in a single wavelength-conversion layer with a first surface and a second surface, each region extending entirely through the layer, at least two among the first, second, and third conversion layer materials being wavelength-converting phosphor materials; and (d) a set of sidewall layers arranged between each pair of adjacent regions against the respective conversion materials of those regions, the sidewall layers being arranged so as to reduce transmission of light between adjacent regions of the conversion layer materials, each sidewall layer extending entirely through the layer.

Example 2. The wavelength-conversion layer of Example 1, the first, second, and third conversion layer materials including a first wavelength-converting phosphor material, a second wavelength-converting phosphor material, and a third wavelength-converting phosphor material, each wavelength-converting phosphor material absorbing light at a first wavelength and in turn emitting corresponding down-converted light at different corresponding down-converted wavelengths.

Example 3. The wavelength-conversion layer of Example 1, the first, second, and third conversion layer materials including a first wavelength-converting phosphor material, a second wavelength-converting phosphor material, and a transparent material, each wavelength-converting phosphor material absorbing light at a first wavelength and in turn emitting corresponding down-converted light at different corresponding down-converted wavelengths, the transparent material being transparent at the first wavelength and emitting no down-converted light.

Example 4. The wavelength-conversion layer of Examples 1 through 3, one or both of the first or second sidewall layers being arranged as optical reflectors.

Example 5. The wavelength-conversion layer of Example 4, one or both of the first or second sidewall layers including one or more metal layers or one or more dielectric layers.

Example 6. The wavelength-conversion layer of any one of Examples 1 through 5, one or both of the first or second sidewall layers including one or more optical absorbers.

Example 7. The wavelength-conversion layer of Example 6, one or both of the first or second sidewall layers including one or more absorptive pigments.

Example 8. The wavelength-conversion layer of any one of Examples 1 through 7, one or both of the first or second sidewall layers including one or more optical scatterers.

Example 9. The wavelength-conversion layer of Example 8, one or both of the first or second sidewall layers including light scattering particles.

Example 10. The wavelength-conversion layer of any one of Examples 1 through 9, the first and second sidewall layers having nonzero thickness that is less than 2.0 μm thick, less than 1.0 μm thick, less than 0.5 μm thick, less than 0.20 μm thick, less than 0.10 μm thick, or less than 0.05 μm thick.

Example 11. The wavelength-conversion layer of any one of Examples 1 through 10, an aspect ratio of sidewall layer height to thickness is greater than 10:1, greater than 12:1, greater than 15:1, greater than 20:1, greater than 50:1, greater than 100:1, or greater than 300:1.

Example 12. The wavelength-conversion layer of any one of Examples 1 through 11: (i) a first subset of the sidewalls separating adjacent regions of the first and second conversion layer materials, a second subset of the sidewalls separating adjacent regions of the first and third conversion layer materials, a third subset of the sidewalls separating adjacent regions of the second and third conversion layer materials, and (ii) the sidewalls of the first and second subsets having nonzero thickness that is less than 10%, less than 20%, less than 25%, less than 33%, less than 50%, about equal to 50%, less than 66%, less than 75%, less than 80%, or less than 90% of thickness of the sidewalls of the third subset.

Example 13. The wavelength-conversion layer of any one of Examples 1 through 12, the regions of the first, second, and third conversion layer materials being arranged in the wavelength-conversion layer as an array, the array having a nonzero spacing that is less than 1.0 mm, less than 0.50 mm, less than 0.33 mm, less than 0.20 mm, less than 0.10 mm, less than 0.08 mm, less than 0.05 mm, less than 0.033 mm, or less than 0.020 mm.

Example 14. A light-emitting device incorporating the wavelength-conversion layer of any one of Examples 1 through 13, the light-emitting device comprising: (a) the wavelength-conversion layer; and (b) an array of semiconductor light-emitting pixels that emit light at a first wavelength, spacing of the light-emitting pixels substantially matching spacing of the regions of the first, second, and third conversion-layer materials, the light-emitting pixel array being positioned so that light emitted by the light-emitting pixels enters the first surface of the wavelength-conversion layer and is at least partly absorbed by wavelength-converting phosphor materials, resulting in emission from those phosphor materials of down-converted light at one or more down-converted wavelengths longer than the first wavelength, the light-emitting pixel array being positioned so that each pixel thereof is substantially aligned with a corresponding one of the regions of first, second, or third conversion-layer materials.

Example 15. The device of Example 14, each light-emitting pixel of the array being operable independently of at least one other light-emitting pixel of the array.

Example 16. The device of Example 14, each light-emitting pixel of the array being operable independently of all other light-emitting pixels of the array.

Example 17. The device of any one of Examples 14 through 16, the device exhibiting a contrast ratio for light exiting from adjacent regions of the wavelength-conversion layer that is greater than 5:1, greater than 10:1, greater than 20:1, greater than 50:1, greater than 100:1, or greater than 300:1.

Example 18. The device of any one of Examples 14 through 17, the first surface of the wavelength-conversion layer being positioned directly against a light-emitting surface of the light-emitting pixel array.

Example 19. The device of any one of Examples 14 through 17, further comprising one or more transparent dielectric layers between the wavelength-conversion layer and a light-emitting surface of the light-emitting pixel array, the first surface of the wavelength-conversion layer being positioned against one of the dielectric layers.

Example 20. The device of any one of Examples 14 through 19, the light-emitting pixels of the array emitting UV light, the first, second, and third conversion layer materials including a first wavelength-converting phosphor material that absorbs UV light and emits blue light, a second wavelength-converting phosphor material that absorbs UV light and emits green light, and a third wavelength-converting phosphor material that absorbs UV light and emits red light.

Example 21. The device of any one of Examples 14 through 19, the light-emitting pixels of the array emitting blue light, the first, second, and third conversion layer materials including a first wavelength-converting phosphor material that absorbs blue light and emits green light, a second wavelength-converting phosphor material that absorbs blue light and emits red light, and a transparent material that transmits blue light and emits no down-converted light.

Example 22. The device of any one of Examples 14 through 21, the array of semiconductor light-emitting pixels comprising an array of semiconductor light-emitting diodes (LEDs).

Example 23. The device of any one of Examples 14 through 22, the light-emitting diodes including one or more doped or undoped II-VI, or Group IV semiconductor materials or alloys or mixtures thereof.

Example 24. The device of any one of Examples 14 through 23, each light-emitting diode including one or more p-n junctions, one or more quantum wells, one or more multi-quantum wells, or one or more quantum dots.

Example 25. The device of any one of Examples 14 through 24, the light emitted by the semiconductor light-emitting pixels having a vacuum wavelength greater than 0.20 µm, greater than 0.4 µm, greater than 0.8 µm, less than 10. µm, less than 2.5 µm, or less than 1.0 µm.

Example 26. A method for making the device of any one of Examples 14 through 25, comprising positioning the wavelength-conversion layer with the first surface thereof facing light-emitting surfaces of the light-emitting pixels of the array.

Example 27. The method of Example 26, the first surface of the optical element being positioned directly against the light-emitting surfaces.

Example 28. The method of Example 26, one or more transparent dielectric layers being positioned between the optical element and the light-emitting pixel array.

Example 29. A method for making the wavelength-conversion layer of any one of Examples 1 through 25, the method comprising: (A) forming, growing, or depositing regions of a first conversion layer material on a set of unmasked first pixel areas of a surface of a substrate, a set of second pixel areas of the substrate surface and a set of third pixel areas of the substrate surface being masked, the sets of first, second, and third pixel areas contiguously filling at least a portion of the substrate surface; (B) selectively removing mask material from the second pixel areas while leaving mask material on the third pixel areas; (C) forming, growing, or depositing a first sidewall layer on exposed side surfaces of both the regions of the first conversion layer material and the mask material remaining on the third pixel areas, those having been exposed by removal of mask material from the second pixel areas; (D) forming, growing, or depositing regions of a second conversion layer material, different from the first conversion layer material, on the second pixel areas, each side surface of the regions of the second conversion layer material being positioned against the first sidewall layer; (E) removing mask material from the third pixel areas; (F) forming, growing, or depositing a second sidewall layer on exposed side surfaces of the regions of the first conversion layer material and exposed portions of the first sidewall layer on side surfaces of the regions of the second conversion layer material, those having been exposed by removal of mask material from the third pixel areas; and (G) forming, growing, or depositing regions of a third conversion layer material, different from the first and second conversion layer materials, on the third pixel areas, each side surface of the deposited third conversion layer material being positioned against the second sidewall layer, at least two among the first, second, and third conversion layer materials being wavelength-converting phosphor materials, the regions of the first, second, and third conversion layer materials forming a wavelength-conversion layer.

Example 30. The method of Example 29, forming, growing, or depositing one or more of the first, second, or third conversion layer materials including one or more of blade coating, spray coating, drop dispensing, particle aggregation or self-assembly, ALD or CVD of a binder coating onto phosphor particles, or other suitable methods.

Example 31. The method of any one of Examples 29 or 30, forming, growing, or depositing one or more of the first, second, or third conversion layer materials including curing that conversion layer material.

Example 32. The method of Example 31, the curing being carried out for two hours or less at temperatures that remain below 130° C.

Example 33. The method of any one of Examples 29 through 32, further comprising forming, growing, or depositing mask material on the second pixel areas, and forming, growing, or depositing mask material on the third pixel areas.

Example 34. The method of any one of Examples 29 through 33, the mask material on the second pixel areas and the mask material on the third pixel areas being the same mask material, the mask material being removed from the second pixel areas using one or more spatially selective material removal techniques.

Example 35. The method of any one of Examples 29 through 33, the mask material on the second pixel areas differing from the mask material on the third pixel areas.

Example 36. The method of Example 35, the mask material on the third pixel areas being relatively resistant to a mask-stripping procedure used for removing mask material from the second pixel areas.

Example 37. The method of any one of Examples 35 or 36, the mask material on the second pixels areas being removed by treatment with one or more solvents.

Example 38. The method of any one of Examples 35 through 37, the mask material on the third pixel areas being removed by plasma ashing or plasma etching.

Example 39. The method of any one of Examples 35 through 38, the mask material on the second pixel areas including a positive photoresist material, the mask material on the third pixel areas including a negative photoresist material.

Example 40. The method of any one of Examples 29, through 39, the first and second sidewall layers being arranged so as to reduce transmission of light between adjacent regions of the conversion layer materials.

Example 41. The method of Example 40, one or both of the first or second sidewall layers being arranged as optical reflectors.

Example 42. The method of Example 41, one or both of the first or second sidewalls including one or more metal layers or one or more dielectric layers.

Example 43. The method of any one of Examples 40 through 42, one or both of the first or second sidewall layers including one or more optical absorbers.

Example 44. The method of Example 43, one or both of the first or second sidewall layers including one or more absorptive pigments.

Example 45. The method of any one of Examples 40 through 44, one or both of the first or second sidewall layers including one or more optical scatterers.

Example 46. The method of Example 45, one or both of the first or second sidewall layers including light scattering particles.

Example 47. The method of any one of Examples 29 through 46, the first and second sidewall layers having nonzero thickness that is less than 2.0 µm thick, less than 1.0 µm thick, less than 0.5 µm thick, less than 0.20 µm thick, less than 0.10 µm thick, or less than 0.05 µm thick.

Example 48. The method of any one of Examples 29 through 47, an aspect ratio of sidewall layer height to combined thickness of the first and second sidewall layers is greater than 10:1, greater than 12:1, greater than 15:1, greater than 20:1, greater than 50:1, greater than 100:1, or greater than 300:1.

Example 49. The method of any one of Examples 29 through 48, (i) a first subset of the sidewalls separating adjacent regions of the first and second conversion layer materials comprising only the first sidewall layer, (ii) a second subset of the sidewalls separating adjacent regions of the first and third conversion layer materials comprising only the second sidewall layer, (ii) a third subset of the sidewalls separating adjacent regions of the second and third conversion layer materials comprising both first and second sidewall layers.

Example 50. The method of Example 49, the sidewalls of the first and second subsets having nonzero thickness that is less than 10%, less than 20%, less than 25%, less than 33%, less than 50%, about equal to 50%, less than 66%, less than 75%, less than 80%, or less than 90% of thickness of the sidewalls of the third subset.

Example 51. The method of any one of Examples 29, through 50, further comprising, after forming, growing or depositing the second conversion layer material, removing first sidewall material from top surfaces of the first conversion layer material and top surfaces of mask material on the third pixel areas.

Example 52. The method of any one of Examples 29 through 51, further comprising, after forming, growing or depositing the third conversion layer material, removing second sidewall material from surfaces of the first and second conversion layer materials opposite the substrate.

Example 53. The method of any one of Examples 29 through 52, further comprising removing the substrate.

Example 54. The method of Example 53, further comprising removing first and second sidewall materials from surfaces of the second and third conversion layer materials, respectively, that had been facing the substrate.

Example 55. The method of any one of Examples 29 through 54, the regions of the first, second, and third conversion layer materials being arranged in the wavelength-conversion layer as an array, the array having a nonzero spacing that is less than 1.0 mm, less than 0.50 mm, less than 0.33 mm, less than 0.20 mm, less than 0.10 mm, less than 0.08 mm, less than 0.05 mm, less than 0.033 mm, or less than 0.020 mm.

Example 56. The method of any one of Examples 29 through 55, further comprising positioning the wavelength-conversion layer facing an emission surface of an array of light-emitting pixels so that each pixel of the array is aligned with a corresponding region of one of the first, second, or third conversion layer materials, spacing of the array of light-emitting pixels matching the spacing of the array of the wavelength-conversion layer.

Example 57. The method of Example 56, further comprising, after positioning the wavelength-conversion layer, removing the substrate and removing first and second sidewall materials from surfaces of the second and third conversion layer materials, respectively, that had been facing the substrate.

This disclosure is illustrative and not limiting. Further modifications will be apparent to one skilled in the art in light of the present disclosure and are intended to fall within the scope of the present disclosure or appended claims. It is intended that equivalents of the disclosed example embodiments and methods, or modifications thereof, shall fall within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore, the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset. Accordingly, the appended claims are hereby incorporated in their entirety into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The words "comprising," "including," "having," and variants thereof, wherever they appear, shall be construed as open ended terminology, with the same meaning as if a phrase such as "at least" were appended after each instance thereof, unless explicitly stated otherwise. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively unless: (i) it is explicitly stated otherwise, e.g., by use of "either . . . or," "only one of," or similar language; or (ii) two or more of the listed alternatives are understood or disclosed (implicitly or explicitly) to be incompatible or mutually exclusive within the particular context. In that latter case, "or" would be understood to encompass only those combinations involving non-mutually-exclusive alternatives. In one example, each of "a dog or a cat," "one or more of a dog or a cat," and "one or more dogs or cats" would be interpreted as one or more dogs without any cats, or one or more cats without any dogs, or one or more of each. In another example, each of "a dog, a cat, or a mouse," "one or more of a dog, a cat, or a mouse," and "one or more dogs, cats, or mice" would be interpreted as (i) one or more dogs without any cats or mice, (ii) one or more cats without and dogs or mice, (iii) one or more mice without any dogs or cats, (iv) one or more dogs and one or more cats without any mice, (v) one or more dogs and one or more mice without any cats, (vi) one or more cats and one or more mice without any dogs, or (vii) one or more dogs, one or more cats, and one or more mice. In another example, each of "two or more of a dog, a cat, or a mouse" or "two or more dogs, cats, or mice" would be interpreted as (i) one or more dogs and one or more cats without any mice, (ii) one or more dogs and one or more mice without any cats, (iii) one or more cats and one or more mice without and dogs, or (iv) one or more dogs, one or more cats, and one or more mice; "three or more," "four or more," and so on would be analogously interpreted.

For purposes of the present disclosure or appended claims, when a numerical quantity is recited (with or without terms such as "about equal to," "substantially equal to," "greater than about," "less than about," and so forth), standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A wavelength-conversion layer comprising:
   a set of multiple regions of a first conversion layer material;
   a set of multiple regions of a second conversion layer material;
   a set of multiple regions of a third conversion layer material, the regions of the first, second, and third conversion layer materials being contiguously arranged in a single wavelength-conversion layer with a first surface and a second surface, each region extending entirely through the single wavelength-conversion layer, at least two among the first, second, and third conversion layer materials being wavelength-converting phosphor materials; and
   a set of sidewall layers arranged between each pair of adjacent regions against the respective conversion layer materials of those regions, the sidewall layers being arranged so as to reduce transmission of light between adjacent regions of the conversion layer materials, each sidewall layer extending entirely through the single wavelength-conversion layer,
   a first subset of the sidewall layers separating adjacent regions of the first and second conversion layer materials, a second subset of the sidewall layers separating adjacent regions of the first and third conversion layer materials, a third subset of the sidewall layers separating adjacent regions of the second and third conversion layer materials, and the sidewall layers of the first and second subsets having a nonzero thickness that is about equal to 50% of a thickness of the sidewall layers of the third subset.

2. The wavelength-conversion layer of claim 1, wherein either: (i) the first, second, and third conversion layer materials include a first wavelength-converting phosphor material, a second wavelength-converting phosphor material, and a third wavelength-converting phosphor material, each wavelength-converting phosphor material absorbing light at a first wavelength and in turn emitting corresponding down-converted light at different corresponding down-converted wavelengths, or (ii) the first, second, and third conversion layer materials include a first wavelength-converting phosphor material, a second wavelength-converting phosphor material, and a transparent material, each wavelength-converting phosphor material absorbing light at a first wavelength and in turn emitting corresponding down-converted light at different corresponding down-converted wavelengths, the transparent material being transparent at the first wavelength and emitting no down-converted light.

3. The wavelength-conversion layer of claim 1, one or more of the sidewall layers being arranged as optical reflectors, one or more of the first or second sidewall layers including one or more optical absorbers, or one or more of the sidewall layers including one or more optical scatterers.

4. The wavelength-conversion layer of claim 1, the sidewall layers of the first and second subsets having a nonzero thickness that is less than 2.0 µm thick.

5. The wavelength-conversion layer of claim 1, an aspect ratio of a height of the sidewall layers to a thickness of the sidewall layers being greater than 20:1.

6. The wavelength-conversion layer of claim 1, the regions of the first, second, and third conversion layer materials being arranged in the single wavelength-conversion layer as an array, the array having a nonzero spacing that is less than 0.10 mm.

7. A light-emitting device incorporating the wavelength-conversion layer of claim 1, the light-emitting device comprising:
   The single wavelength-conversion layer; and
   an array of semiconductor light-emitting pixels that emit light at a first wavelength, spacing of the light-emitting pixels substantially matching spacing of the regions of the first, second, and third conversion layer materials, the light-emitting pixel array being positioned so that the light emitted by the light-emitting pixels enters the first surface of the single wavelength-conversion layer and is at least partly absorbed by the wavelength-converting phosphor materials, resulting in emission from those phosphor materials of down-converted light at one or more down-converted wavelengths longer than the first wavelength, the light-emitting pixel array being positioned so that each pixel thereof is substantially aligned with a corresponding one of the regions of first, second, or third conversion layer materials.

8. The device of claim 7, each light-emitting pixel of the array being operable independently of at least one other light-emitting pixel of the array, the device exhibiting a contrast ratio for light exiting from adjacent regions of the single wavelength-conversion layer that is greater than 5:1.

9. The device of claim 7, wherein either: (i) the light-emitting pixels of the array emit UV light, and the first, second, and third conversion layer materials include a first wavelength-converting phosphor material that absorbs UV light and emits blue light, a second wavelength-converting phosphor material that absorbs UV light and emits green light, and a third wavelength-converting phosphor material that absorbs UV light and emits red light, or (ii) the light-emitting pixels of the array emit blue light, and the first, second, and third conversion layer materials include a first wavelength-converting phosphor material that absorbs blue light and emits green light, a second wavelength-converting phosphor material that absorbs blue light and emits red light, and a transparent material that transmits blue light and emits no down-converted light.

10. A method for making the device of claim 7, comprising positioning the single wavelength-conversion layer with the first surface thereof facing light-emitting surfaces of the light-emitting pixels of the array.

11. A method for making a wavelength-conversion layer, the method comprising:
   forming, growing, or depositing regions of a first conversion layer material on a set of unmasked first pixel areas of a surface of a substrate, a set of second pixel areas of the surface of the substrate surface and a set of third pixel areas of the surface of the substrate being masked, the sets of first, second, and third pixel areas contiguously filling at least a portion of the surface of the substrate;
   selectively removing the mask material from the second pixel areas while leaving the mask material on the third pixel areas;
   forming, growing, or depositing a first sidewall layer on exposed side surfaces of both the regions of the first conversion layer material and the mask material remaining on the third pixel areas, those having been exposed by removal of the mask material from the second pixel areas;
   forming, growing, or depositing regions of a second conversion layer material, different from the first conversion layer material, on the second pixel areas, each side surface of the regions of the second conversion layer material being positioned against the first sidewall layer;
   removing the mask material from the third pixel areas;
   forming, growing, or depositing a second sidewall layer on exposed side surfaces of the regions of the first conversion layer material and exposed portions of the first sidewall layer on side surfaces of the regions of the second conversion layer material, those having been exposed by removal of mask material from the third pixel areas; and
   forming, growing, or depositing regions of a third conversion layer material, different from the first and second conversion layer materials, on the third pixel areas, each side surface of the deposited third conversion layer material being positioned against the second sidewall layer, at least two among the first, second, and third conversion layer materials being wavelength-converting phosphor materials, the regions of the first, second, and third conversion layer materials forming the wavelength-conversion layer.

12. The method of claim 11, wherein forming, growing, or depositing one or more of the first, second, or third conversion layer materials includes one or more of blade coating, spray coating, drop dispensing, particle aggregation or self-assembly, ALD or CVD of a binder coating onto phosphor particles, or other suitable methods.

13. The method of claim 11, wherein forming, growing, or depositing one or more of the first, second, or third conversion layer materials includes curing a corresponding conversion layer material, the curing being carried out for two hours or less at temperatures that remain below 130° C.

14. The method of claim 11, further comprising forming, growing, or depositing the mask material on the second pixel areas, and forming, growing, or depositing the mask material on the third pixel areas.

15. The method of claim 11, the mask material on the second pixel areas differing from the mask material on the third pixel areas.

16. The method of claim 15, the mask material on the third pixel areas being relatively resistant to a mask-stripping procedure used for removing the mask material from the second pixel areas.

17. The method of claim 15, the mask material on the second pixels areas being removed by treatment with one or more solvents, and the mask material on the third pixel areas being removed by plasma ashing or plasma etching.

18. The method of claim 11, further comprising, (i) after forming, growing or depositing the second conversion layer material, removing a first sidewall material from top surfaces of the first conversion layer material and top surfaces of the mask material on the third pixel areas, or (ii) after forming, growing or depositing the third conversion layer material, removing a second sidewall material from surfaces of the first and second conversion layer materials opposite the substrate.

19. The method of claim 11, further comprising (i) removing the substrate, and (ii) removing first and second sidewall materials from surfaces of the second and third conversion layer materials, respectively, that had been facing the substrate.

\* \* \* \* \*